(12) United States Patent
Tan et al.

(10) Patent No.: US 12,200,538 B2
(45) Date of Patent: Jan. 14, 2025

(54) METHODS AND PROCEDURES FOR CRC AIDED ENCODING AND BP DECODING FOR POLAR CODES

(71) Applicant: InterDigital Patent Holdings, Inc., Wilmington, DE (US)

(72) Inventors: Ahmet Serdar Tan, London (GB); Onur Sahin, London (GB); Sungkwon Hong, Dongjak-gu (KR)

(73) Assignee: InterDigital Patent Holdings, Inc., Wilmington, DE (US)

( * ) Notice: Subject to any disclaimer, the term of this patent is extended or adjusted under 35 U.S.C. 154(b) by 0 days.

(21) Appl. No.: 18/281,629

(22) PCT Filed: Mar. 11, 2022

(86) PCT No.: PCT/US2022/020021
§ 371 (c)(1),
(2) Date: Sep. 12, 2023

(87) PCT Pub. No.: WO2022/192717
PCT Pub. Date: Sep. 15, 2022

(65) Prior Publication Data
US 2024/0187921 A1    Jun. 6, 2024

Related U.S. Application Data

(60) Provisional application No. 63/160,183, filed on Mar. 12, 2021.

(51) Int. Cl.
*H03M 13/00* (2006.01)
*H03M 13/39* (2006.01)
(Continued)

(52) U.S. Cl.
CPC ....... *H04W 28/04* (2013.01); *H03M 13/3927* (2013.01); *H04L 1/0057* (2013.01); *H04L 1/0061* (2013.01)

(58) Field of Classification Search
None
See application file for complete search history.

(56) References Cited

U.S. PATENT DOCUMENTS 10,075,197 B1 *   9/2018   Noh ............... H04L 1/0057
2018/0227076 A1 * 8/2018   Koike-Akino ...... H03M 13/353
(Continued)

FOREIGN PATENT DOCUMENTS

EP         3859979 A1      8/2021
WO    WO 2019183309 A1    9/2019
WO    WO 2020067637 A1    4/2020

OTHER PUBLICATIONS

Tan, Ahmet Serdar, et al., "CRC Aided Short-Cycle Free BP Decoding for Polar Codes", IEEE, 2021, 6 pages.
(Continued)

*Primary Examiner* — Mujtaba M Chaudry
(74) *Attorney, Agent, or Firm* — Flaster Greenberg P.C.

(57) ABSTRACT

Methods and apparatuses for relaxed polar coding, including cyclic redundancy check (CRC) aided encoding and belief propagation (BP) decoding for relaxed polar codes in wireless communications, are provided. For example, a method comprises determining: 1) a first set of encoding nodes used for creating CRC bits, 2) a first set of polarization branches, each associated with a respective encoding node of the first set of encoding nodes, and 3) a second set of polarization branches, each of the second set of polarization branches is at least one level higher than a respective polarization branch of the first set of polarization branches. The method also comprises performing polar encoding operation(s) for the second set of polarization branches including relaxation, generating a second set of encoding nodes based on the performed polar encoding operation(s) for the second set of (Continued)

polarization branches, and transmitting polar code bits using the generated second set of encoding nodes.

13 Claims, 27 Drawing Sheets

(51) Int. Cl.
*H04L 1/00* (2006.01)
*H04W 28/04* (2009.01)

(56) References Cited

U.S. PATENT DOCUMENTS

2018/0376468 A1* 12/2018 Lin ................. H04L 1/0064
2019/0036550 A1* 1/2019 Koike-Akino .... H03M 13/2906
2022/0278698 A1* 9/2022 Koike-Akino ........ H03M 13/13

OTHER PUBLICATIONS

Eslami, et al., "On finite-length performance of polar codes: stopping sets, error floor, and concatenated design," IEEE Trans. Commun., vol. 61, No. 3, Mar. 2013, 11 pages.
Hong, Sungkwon, et al., "Improved CRC aided BP decoding for polar codes", Electronic Letters, vol. 57, No. 13, Jun. 2021, 3 pages.
El-Khamy, Mostafa, et. al., "Relaxed Polar Codes", Available at: https://arxiv.org/pdf/1501.06091.pdf, 14 pages. Jul. 15, 2015.
El-Khamy, et al., "Relaxed Polar Codes", IEEE Transactions on Information Theory, vol. 63, No. 4, Apr. 2017, pp. 1-14.
Xu, et al., "XJ-BP: Express Journey Belief Propagation Decoding for Polar Codes", IEEE Global Communications Conference (GLOBECOM), Dec. 2014, 6 pages.
Third Generation Partnership Project (3GPP): "Technical Specification Group Radio Access Network; NR; Multiplexing and channel coding (Release 15)," 3GPP TS 38.212 V15.0.0 (Dec. 2017).
Vangala, et. al., "A Comparative Study of Polar Code Constructions for the AWGN Channel", rXiv:1501.02473v1 [cs.IT]; Available at https://arxiv.org/pdf/1501.02473.pdf, Jan. 11, 2015, 9 pages.
Wang, Xinyi et al, "Relaxed Polar Codes under AWGN Channels with Low Complexity and Low Latency", The 28th Wireless and Optical Communication Conference (WOCC 2019), 5 pages.
Tajima, et al., "Iterative Decoding Based on Concatenated Belief Propagation for CRC-Aided Polar Codes," Proceedings, APSIPA Annual Summit and Conference 2018, Hawaii, Nov. 12-15, 2018.
Geiselhart, Marvin et al., "CRC-Aided Belief Propagation List Decoding of Polar Codes", IEEE, 2020, 6 pages.
Cammerer et al., "Sparse Graphs for Belief Propagation Decoding of Polar Codes," 2018 IEEE International Symposium on Information Theory (ISIT), Vail, CO, USA, pp. 1465-1469 (2018).
Tai, et al. "List Decoding of Polar Codes", arXiv:1206.0050v1, May 31, 2012, pp. 1-11.
Koike-Akino, et al., "Irregular Polar Coding for Multi-Level Modulation in Complexity-Constrained Lightwave Systems", 2017 European Conference on Optical Communication (ECOC), IEEE, Sep. 17, 2017, 3 pages.
"Channel Polarization: A Method for Constructing Capacity-Achieving Codes for Symmetric Binary-Input Memoryless Channels", IEEE Transactions on Information Theory, vol. 55, No. 7, Jul. 2009, pp. 3051-3073.
Niu, Kai, et al., "CRC-Aided Decoding of Polar Codes", IEEE Communications Letters, vol. 16, No. 10, Oct. 2012, pp. 1668-1671.

* cited by examiner

◎ : Nodes to Create CRC Bits

⬜ : Relaxation

N=16, K=10, C=3

CRC Inputs from Layer 0

◎ : Frozen

◎ : Unfrozen

⊕ : CRC Bit (Unfrozen)

◎ : Node to Create CRC Bits

◎ : Unfrozen Node to Create CRC Bits

⬜ : Relaxation

□ : Check Node
○ : Variable Node
⊗ : Frozen Variable Node
⊙ : Unfrozen Variable Node
⊕ : Unfrozen Variable Node (CRC)
◉ : Variable Nodes to Create CRC
◍ : Unfrozen Variable Node to Create CRC Bits

METHODS AND PROCEDURES FOR CRC AIDED ENCODING AND BP DECODING FOR POLAR CODES

CROSS-REFERENCE TO RELATED APPLICATION(S)

This application is a U.S. national stage application under 35 U.S.C. 371 of International Patent Application No. PCT/US2022/020021, filed Mar. 11, 2022, which is a non-provisional filing of, and claims priority to and the benefit of U.S. Provisional Application No. 63/160,183 filed in the U.S. Patent and Trademark Office on Mar. 12, 2021, the entire content of each of which is being incorporated herein by reference as if fully set forth below in its entirety and for all applicable purposes.

SUMMARY

Embodiments disclosed herein generally relate to wireless communications networks. For example, one or more embodiments disclosed herein are related to methods, apparatuses, and procedures for polar encoding and decoding, including cyclic redundancy check (CRC) aided encoding and belief propagation (BP) decoding for polar codes in wireless communications (e.g., 5G NR network).

In one embodiment, a method implemented by a wireless transmit/receive unit (WTRU) for wireless communications includes determining a first set of encoding nodes used for creating a set of CRC bits; determining a first set of polarization branches, and each of the first set of polarization branches is associated with a respective encoding node of the first set of encoding nodes used for creating the set of CRC bits; and determining a second set of polarization branches, and each of the second set of polarization branches is at least one level higher than a respective polarization branch of the first set of polarization branches. The method also includes performing one or more polar encoding operations for the second set of polarization branches; generating a second set of encoding nodes based on the performed one or more polar encoding operations for the second set of polarization branches; and transmitting polar code bits using the generated second set of encoding nodes.

In another embodiment, a method implemented by a WTRU for wireless communications includes determining, for each iteration of a BP decoder in the WTRU, a factor graph corresponding to one of a set of CRC bits being used; determining one or more CRC-dependent relaxation operations used in a polar encoder; and determining whether one or more short cycles in a factor graph is removed based on the determined one or more CRC-dependent relaxation operations.

In another embodiment, a method for wireless communications includes determining a set of input encoding node bits for CRC; performing periodic grouping for the set of input encoding node bits; performing CRC encoding for each group of bits based on the performed periodic grouping; inputting CRC encoded bits to polar encoding; omitting one or more XOR operations in polar encoding; and outputting polar code bits.

In one embodiment, the WTRU comprising a processor, a transmitter, a receiver, and/or memory is configured to implement one or more methods disclosed herein. For example, the WTRU is configured to determine a first set of encoding nodes used for creating a set of CRC bits; determine a first set of polarization branches, and each of the first set of polarization branches is associated with a respective encoding node of the first set of encoding nodes used for creating the set of CRC bits; determine a second set of polarization branches, and each of the second set of polarization branches is at least one level higher than a respective polarization branch of the first set of polarization branches. The WTRU is further configured to perform one or more polar encoding operations for the second set of polarization branches; generate a second set of encoding nodes based on the performed one or more polar encoding operations for the second set of polarization branches; and transmit polar code bits using the generated second set of encoding nodes.

BRIEF DESCRIPTION OF THE DRAWINGS

A more detailed understanding may be had from the detailed description below, given by way of example in conjunction with the drawings appended hereto. Figures in such drawings, like the detailed description, are examples. As such, the Figures and the detailed description are not to be considered limiting, and other equally effective examples are possible and likely. Furthermore, like reference numerals in the figures indicate like elements, and wherein.

DETAILED DESCRIPTION

In the following detailed description, numerous specific details are set forth to provide a thorough understanding of embodiments and/or examples disclosed herein. However, it will be understood that such embodiments and examples may be practiced without some or all of the specific details set forth herein. In other instances, well-known methods, procedures, components and circuits have not been described in detail, so as not to obscure the following description. Further, embodiments and examples not specifically described herein may be practiced in lieu of, or in combination with, the embodiments and other examples described, disclosed or otherwise provided explicitly, implicitly and/or inherently (collectively "provided") herein. Although various embodiments are described and/or claimed herein in which an apparatus, system, device, etc. and/or any element thereof carries out an operation, process, algorithm, function, etc. and/or any portion thereof, it is to be understood that any embodiments described and/or claimed herein assume that any apparatus, system, device, etc. and/or any element thereof is configured to carry out any operation, process, algorithm, function, etc. and/or any portion thereof.

Communication Networks and Devices

The methods, procedures, apparatuses and systems provided herein are well-suited for communications involving both wired and wireless networks. Wired networks are well-known. An overview of various types of wireless devices and infrastructure is provided with respect to FIGS. 1A-1D, where various elements of the network may utilize, perform, be arranged in accordance with and/or be adapted and/or configured for the methods, apparatuses and systems provided herein.

Figure 1A:
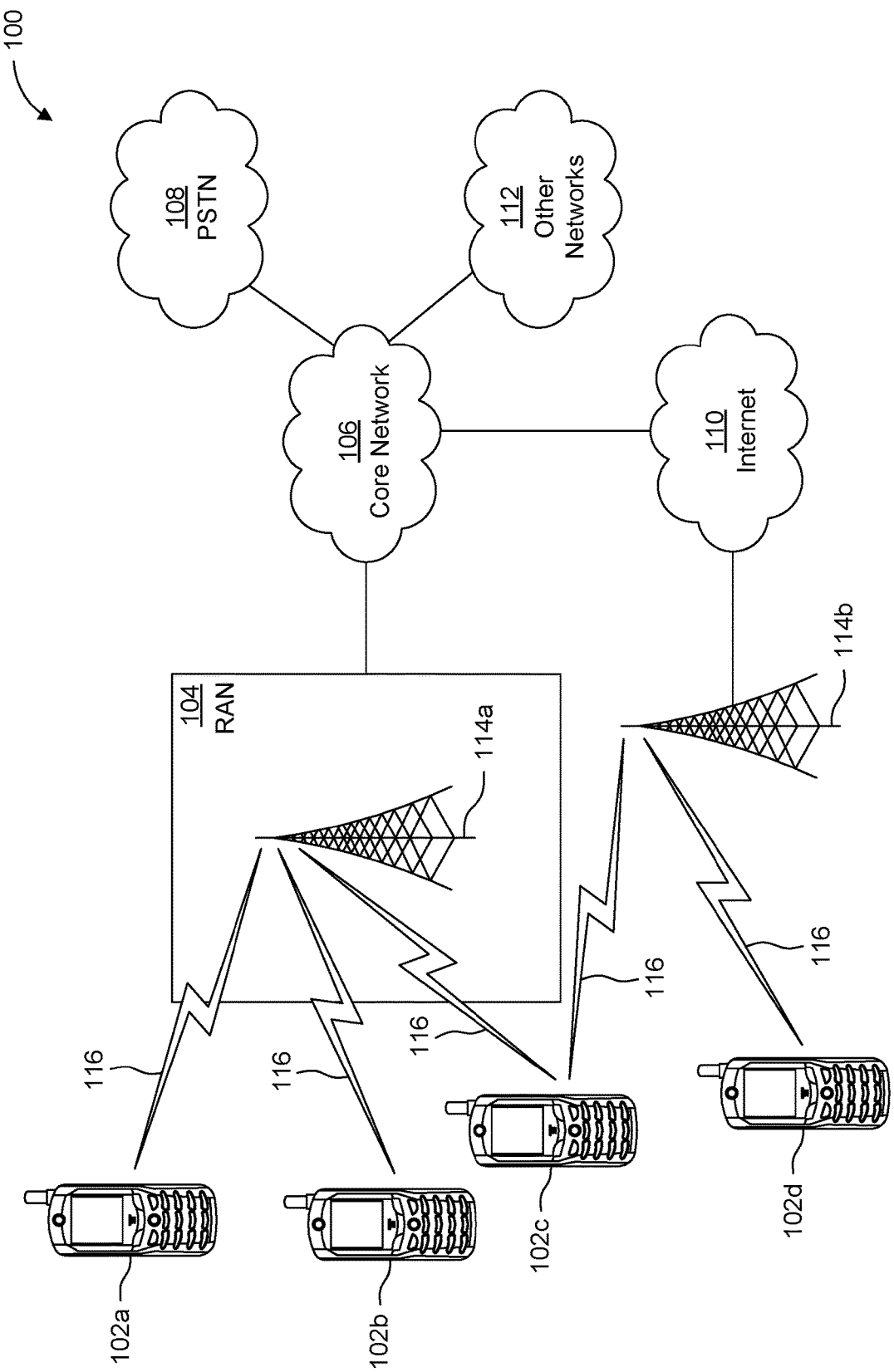
FIG. 1A is a system diagram illustrating an example communications system in which one or more disclosed embodiments may be implemented.

FIG. 1A is a diagram illustrating an example communications system 100 in which one or more disclosed embodiments may be implemented. The communications system 100 may be a multiple access system that provides content, such as voice, data, video, messaging, broadcast, etc., to multiple wireless users. The communications system 100 may enable multiple wireless users to access such content through the sharing of system resources, including wireless bandwidth. For example, the communications systems 100 may employ one or more channel access methods, such as code division multiple access (CDMA), time division multiple access (TDMA), frequency division multiple access (FDMA), orthogonal FDMA (OFDMA), single-carrier FDMA (SC-FDMA), zero-tail unique-word DFT-Spread OFDM (ZT UW DTS-s OFDM), unique word OFDM (UW-OFDM), resource block-filtered OFDM, filter bank multicarrier (FBMC), and the like.

As shown in FIG. 1A, the communications system 100 may include wireless transmit/receive units (WTRUs) 102a, 102b, 102c, 102d, a RAN 104/113, a CN 106/115, a public switched telephone network (PSTN) 108, the Internet 110, and other networks 112, though it will be appreciated that the disclosed embodiments contemplate any number of WTRUs, base stations, networks, and/or network elements. Each of the WTRUs 102a, 102b, 102c, 102d may be any type of device configured to operate and/or communicate in a wireless environment. By way of example, the WTRUs 102a, 102b, 102c, 102d, any of which may be referred to as a "station" and/or a "STA", may be configured to transmit and/or receive wireless signals and may include a user equipment (UE), a mobile station, a fixed or mobile subscriber unit, a subscription-based unit, a pager, a cellular telephone, a personal digital assistant (PDA), a smartphone, a laptop, a netbook, a personal computer, a wireless sensor, a hotspot or Mi-Fi device, an Internet of Things (IoT) device, a watch or other wearable, a head-mounted display (HMD), a vehicle, a drone, a medical device and applications (e.g., remote surgery), an industrial device and applications (e.g., a robot and/or other wireless devices operating in an industrial and/or an automated processing chain contexts), a consumer electronics device, a device operating on commercial and/or industrial wireless networks, and the like. Any of the WTRUs 102a, 102b, 102c and 102d may be interchangeably referred to as a UE.

The communications systems 100 may also include a base station 114a and/or a base station 114b. Each of the base stations 114a, 114b may be any type of device configured to wirelessly interface with at least one of the WTRUs 102a, 102b, 102c, 102d to facilitate access to one or more communication networks, such as the CN 106/115, the Internet 110, and/or the other networks 112. By way of example, the base stations 114a, 114b may be a base transceiver station (BTS), a Node-B, an eNode B, a Home Node B, a Home eNode B, a gNB, a New Radio (NR) NodeB, a site controller, an access point (AP), a wireless router, and the like. While the base stations 114a, 114b are each depicted as a single element, it will be appreciated that the base stations 114a, 114b may include any number of interconnected base stations and/or network elements.

The base station 114a may be part of the RAN 104/113, which may also include other base stations and/or network elements (not shown), such as a base station controller (BSC), a radio network controller (RNC), relay nodes, etc. The base station 114a and/or the base station 114b may be configured to transmit and/or receive wireless signals on one or more carrier frequencies, which may be referred to as a cell (not shown). These frequencies may be in licensed spectrum, unlicensed spectrum, or a combination of licensed and unlicensed spectrum. A cell may provide coverage for a wireless service to a specific geographical area that may be relatively fixed or that may change over time. The cell may further be divided into cell sectors. For example, the cell associated with the base station 114a may be divided into three sectors. Thus, in one embodiment, the base station 114a may include three transceivers, e.g., one for each sector of the cell. In an embodiment, the base station 114a may employ multiple-input multiple output (MIMO) technology and may utilize multiple transceivers for each sector of the cell. For example, beamforming may be used to transmit and/or receive signals in desired spatial directions.

The base stations 114a, 114b may communicate with one or more of the WTRUs 102a, 102b, 102c, 102d over an air interface 116, which may be any suitable wireless communication link (e.g., radio frequency (RF), microwave, centimeter wave, micrometer wave, infrared (IR), ultraviolet (UV), visible light, etc.). The air interface 116 may be established using any suitable radio access technology (RAT).

More specifically, as noted above, the communications system 100 may be a multiple access system and may employ one or more channel access schemes, such as CDMA, TDMA, FDMA, OFDMA, SC-FDMA, and the like. For example, the base station 114a in the RAN 104/113 and the WTRUs 102a, 102b, 102c may implement a radio technology such as Universal Mobile Telecommunications System (UMTS) Terrestrial Radio Access (UTRA), which may establish the air interface 115/116/117 using wideband CDMA (WCDMA). WCDMA may include communication protocols such as High-Speed Packet Access (HSPA) and/or Evolved HSPA (HSPA+). HSPA may include High-Speed Downlink (DL) Packet Access (HSDPA) and/or High-Speed UL Packet Access (HSUPA).

In an embodiment, the base station 114a and the WTRUs 102a, 102b, 102c may implement a radio technology such as Evolved UMTS Terrestrial Radio Access (E-UTRA), which may establish the air interface 116 using Long Term Evolution (LTE) and/or LTE-Advanced (LTE-A) and/or LTE-Advanced Pro (LTE-A Pro).

In an embodiment, the base station 114a and the WTRUs 102a, 102b, 102c may implement a radio technology such as NR Radio Access, which may establish the air interface 116 using New Radio (NR).

In an embodiment, the base station 114a and the WTRUs 102a, 102b, 102c may implement multiple radio access technologies. For example, the base station 114a and the WTRUs 102a, 102b, 102c may implement LTE radio access and NR radio access together, for instance using dual connectivity (DC) principles. Thus, the air interface utilized by WTRUs 102a, 102b, 102c may be characterized by multiple types of radio access technologies and/or transmissions sent to/from multiple types of base stations (e.g., an eNB and a gNB).

In other embodiments, the base station 114a and the WTRUs 102a, 102b, 102c may implement radio technologies such as IEEE 802.11 (e.g., Wireless Fidelity (WiFi), IEEE 802.16 (e.g., Worldwide Interoperability for Microwave Access (WiMAX)), CDMA2000, CDMA2000 1×, CDMA2000 EV-DO, Interim Standard 2000 (IS-2000), Interim Standard 95 (IS-95), Interim Standard 856 (IS-856), Global System for Mobile communications (GSM), Enhanced Data rates for GSM Evolution (EDGE), GSM EDGE (GERAN), and the like.

The base station 114b in FIG. 1A may be a wireless router, a Home Node B, a Home eNode B, or an access point, for example, and may utilize any suitable RAT for facilitating wireless connectivity in a localized area, such as a place of business, a home, a vehicle, a campus, an industrial facility, an air corridor (e.g., for use by drones), a roadway, and the like. In one embodiment, the base station 114b and the WTRUs 102c, 102d may implement a radio technology such as IEEE 802.11 to establish a wireless local area network (WLAN). In an embodiment, the base station 114b and the WTRUs 102c, 102d may implement a radio technology such as IEEE 802.15 to establish a wireless personal area network (WPAN). In yet another embodiment, the base station 114b and the WTRUs 102c, 102d may utilize a cellular-based RAT (e.g., WCDMA, CDMA2000, GSM, LTE, LTE-A, LTE-A Pro, NR, etc.) to establish a picocell or femtocell. As shown in FIG. 1A, the base station 114b may have a direct connection to the Internet 110. Thus, the base station 114b may not be required to access the Internet 110 via the CN 106/115.

The RAN 104/113 may be in communication with the CN 106/115, which may be any type of network configured to provide voice, data, applications, and/or voice over internet protocol (VoIP) services to one or more of the WTRUs 102a, 102b, 102c, 102d. The data may have varying quality of service (QoS) requirements, such as differing throughput requirements, latency requirements, error tolerance requirements, reliability requirements, data throughput requirements, mobility requirements, and the like. The CN 106/115 may provide call control, billing services, mobile location-based services, pre-paid calling, Internet connectivity, video distribution, etc., and/or perform high-level security functions, such as user authentication. Although not shown in FIG. 1A, it will be appreciated that the RAN 104/113 and/or the CN 106/115 may be in direct or indirect communication with other RANs that employ the same RAT as the RAN 104/113 or a different RAT. For example, in addition to being connected to the RAN 104/113, which may be utilizing a NR radio technology, the CN 106/115 may also be in communication with another RAN (not shown) employing a GSM, UMTS, CDMA 2000, WiMAX, E-UTRA, or WiFi radio technology.

The CN 106/115 may also serve as a gateway for the WTRUs 102a, 102b, 102c, 102d to access the PSTN 108, the Internet 110, and/or the other networks 112. The PSTN 108 may include circuit-switched telephone networks that provide plain old telephone service (POTS). The Internet 110 may include a global system of interconnected computer networks and devices that use common communication protocols, such as the transmission control protocol (TCP), user datagram protocol (UDP) and/or the internet protocol (IP) in the TCP/IP internet protocol suite. The networks 112 may include wired and/or wireless communications networks owned and/or operated by other service providers. For example, the networks 112 may include another CN connected to one or more RANs, which may employ the same RAT as the RAN 104/113 or a different RAT.

Some or all of the WTRUs 102a, 102b, 102c, 102d in the communications system 100 may include multi-mode capabilities (e.g., the WTRUs 102a, 102b, 102c, 102d may include multiple transceivers for communicating with different wireless networks over different wireless links). For example, the WTRU 102c shown in FIG. 1A may be configured to communicate with the base station 114a, which may employ a cellular-based radio technology, and with the base station 114b, which may employ an IEEE 802 radio technology.

Figure 1B:
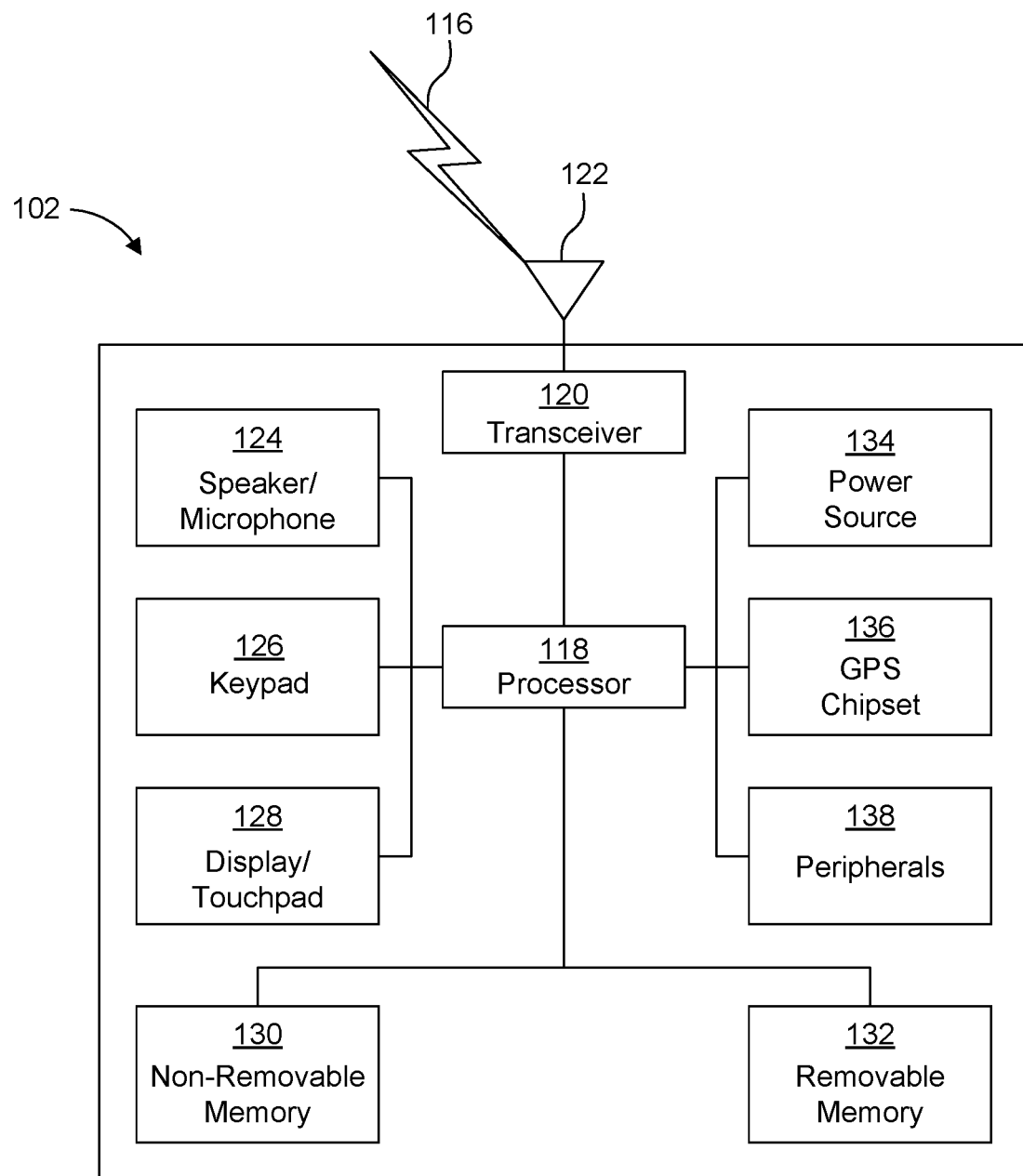
FIG. 1B is a system diagram illustrating an example wireless transmit/receive unit (WTRU) that may be used within the communications system illustrated in FIG. 1A according to an embodiment.

FIG. 1B is a system diagram illustrating an example WTRU 102. As shown in FIG. 1B, the WTRU 102 may include a processor 118, a transceiver 120, a transmit/receive element 122, a speaker/microphone 124, a keypad 126, a display/touchpad 128, non-removable memory 130, removable memory 132, a power source 134, a global positioning system (GPS) chipset 136, and/or other peripherals 138, among others. It will be appreciated that the WTRU 102 may include any sub-combination of the foregoing elements while remaining consistent with an embodiment.

The processor 118 may be a general-purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), a state machine, and the like. The processor 118 may perform signal coding, data processing, power control, input/output processing, and/or any other functionality that enables the WTRU 102 to operate in a wireless environment. The processor 118 may be coupled to the transceiver 120, which may be coupled to the transmit/receive element 122. While FIG. 1B depicts the processor 118 and the transceiver 120 as separate components, it will be appreciated that the processor 118 and the transceiver 120 may be integrated together in an electronic package or chip.

The transmit/receive element 122 may be configured to transmit signals to, or receive signals from, a base station (e.g., the base station 114a) over the air interface 116. For example, in one embodiment, the transmit/receive element 122 may be an antenna configured to transmit and/or receive RF signals. In an embodiment, the transmit/receive element 122 may be an emitter/detector configured to transmit and/or receive IR, UV, or visible light signals, for example. In yet another embodiment, the transmit/receive element 122 may be configured to transmit and/or receive both RF and light signals. It will be appreciated that the transmit/receive element 122 may be configured to transmit and/or receive any combination of wireless signals.

Although the transmit/receive element 122 is depicted in FIG. 1B as a single element, the WTRU 102 may include any number of transmit/receive elements 122. More specifically, the WTRU 102 may employ MIMO technology. Thus, in one embodiment, the WTRU 102 may include two or more transmit/receive elements 122 (e.g., multiple antennas) for transmitting and receiving wireless signals over the air interface 116.

The transceiver 120 may be configured to modulate the signals that are to be transmitted by the transmit/receive element 122 and to demodulate the signals that are received by the transmit/receive element 122. As noted above, the WTRU 102 may have multi-mode capabilities. Thus, the transceiver 120 may include multiple transceivers for enabling the WTRU 102 to communicate via multiple RATs, such as NR and IEEE 802.11, for example.

The processor 118 of the WTRU 102 may be coupled to, and may receive user input data from, the speaker/microphone 124, the keypad 126, and/or the display/touchpad 128 (e.g., a liquid crystal display (LCD) display unit or organic light-emitting diode (OLED) display unit). The processor 118 may also output user data to the speaker/microphone 124, the keypad 126, and/or the display/touchpad 128. In addition, the processor 118 may access information from, and store data in, any type of suitable memory, such as the non-removable memory 130 and/or the removable memory 132. The non-removable memory 130 may include random-access memory (RAM), read-only memory (ROM), a hard disk, or any other type of memory storage device. The removable memory 132 may include a subscriber identity module (SIM) card, a memory stick, a secure digital (SD) memory card, and the like. In other embodiments, the processor 118 may access information from, and store data in, memory that is not physically located on the WTRU 102, such as on a server or a home computer (not shown).

The processor 118 may receive power from the power source 134, and may be configured to distribute and/or control the power to the other components in the WTRU 102. The power source 134 may be any suitable device for powering the WTRU 102. For example, the power source 134 may include one or more dry cell batteries (e.g., nickel-cadmium (NiCd), nickel-zinc (NiZn), nickel metal hydride (NiMH), lithium-ion (Li-ion), etc.), solar cells, fuel cells, and the like.

The processor 118 may also be coupled to the GPS chipset 136, which may be configured to provide location information (e.g., longitude and latitude) regarding the current location of the WTRU 102. In addition to, or in lieu of, the information from the GPS chipset 136, the WTRU 102 may receive location information over the air interface 116 from a base station (e.g., base stations 114a, 114b) and/or determine its location based on the timing of the signals being received from two or more nearby base stations. It will be appreciated that the WTRU 102 may acquire location information by way of any suitable location-determination method while remaining consistent with an embodiment.

The processor 118 may further be coupled to other peripherals 138, which may include one or more software and/or hardware modules that provide additional features, functionality and/or wired or wireless connectivity. For example, the peripherals 138 may include an accelerometer, an e-compass, a satellite transceiver, a digital camera (for photographs and/or video), a universal serial bus (USB) port, a vibration device, a television transceiver, a hands free headset, a Bluetooth® module, a frequency modulated (FM) radio unit, a digital music player, a media player, a video game player module, an Internet browser, a Virtual Reality and/or Augmented Reality (VR/AR) device, an activity tracker, and the like. The peripherals 138 may include one or more sensors, the sensors may be one or more of a gyroscope, an accelerometer, a hall effect sensor, a magnetometer, an orientation sensor, a proximity sensor, a temperature sensor, a time sensor; a geolocation sensor; an altimeter, a light sensor, a touch sensor, a magnetometer, a barometer, a gesture sensor, a biometric sensor, and/or a humidity sensor.

The WTRU 102 may include a full duplex radio for which transmission and reception of some or all of the signals (e.g., associated with particular subframes for both the UL (e.g., for transmission) and downlink (e.g., for reception) may be concurrent and/or simultaneous. The full duplex radio may include an interference management unit 139 to reduce and or substantially eliminate self-interference via either hardware (e.g., a choke) or signal processing via a processor (e.g., a separate processor (not shown) or via processor 118). In an embodiment, the WRTU 102 may include a half-duplex radio for which transmission and reception of some or all of the signals (e.g., associated with particular subframes for either the UL (e.g., for transmission) or the downlink (e.g., for reception)).

Figure 1C:
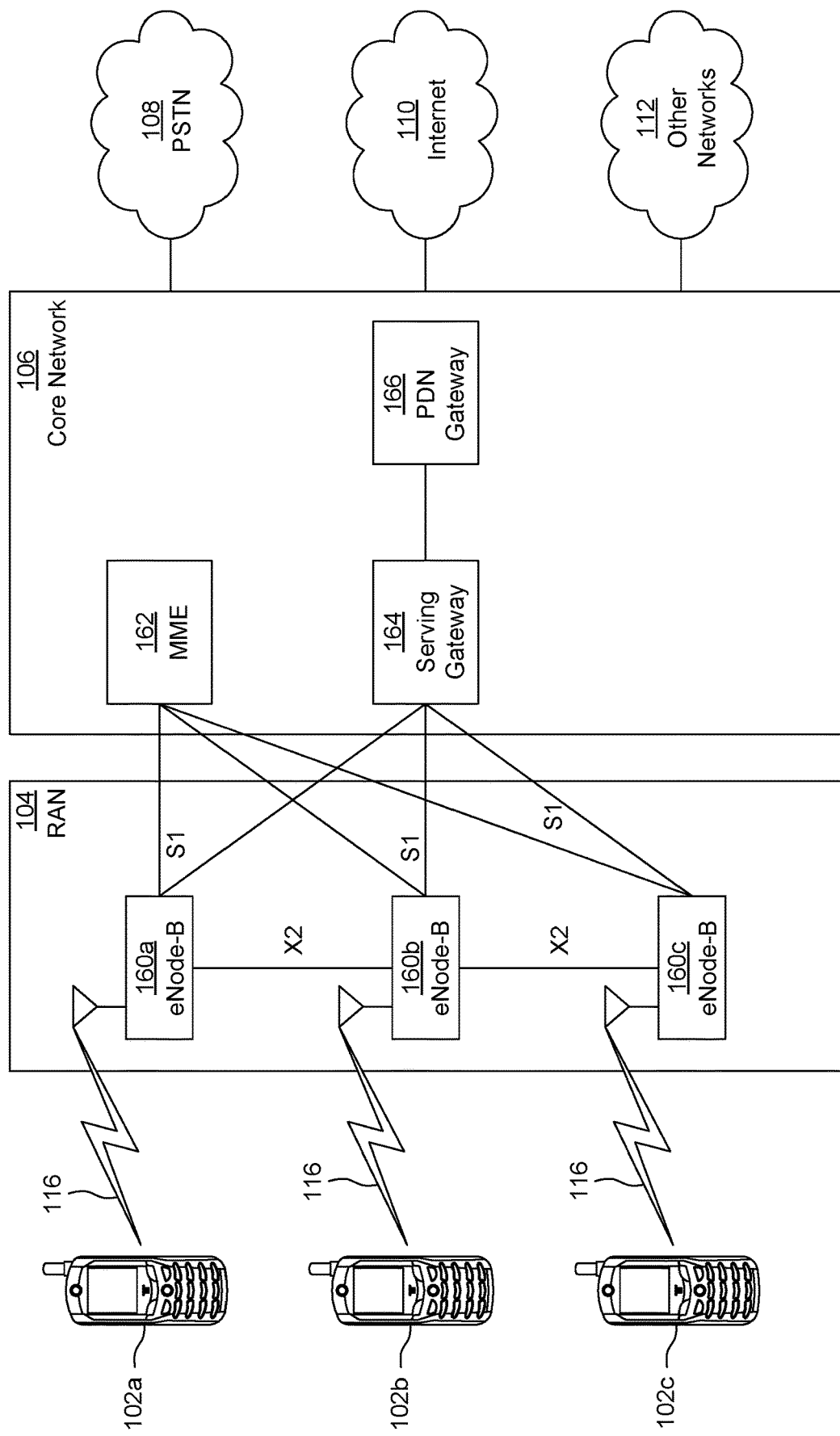
FIG. 1C is a system diagram illustrating an example radio access network (RAN) and an example core network (CN) that may be used within the communications system illustrated in FIG. 1A according to an embodiment.

FIG. 1C is a system diagram illustrating the RAN 104 and the CN 106 according to an embodiment. As noted above, the RAN 104 may employ an E-UTRA radio technology to communicate with the WTRUs 102a, 102b, 102c over the air interface 116. The RAN 104 may also be in communication with the CN 106.

The RAN 104 may include eNode-Bs 160a, 160b, 160c, though it will be appreciated that the RAN 104 may include any number of eNode-Bs while remaining consistent with an embodiment. The eNode-Bs 160a, 160b, 160c may each include one or more transceivers for communicating with the WTRUs 102a, 102b, 102c over the air interface 116. In one embodiment, the eNode-Bs 160a, 160b, 160c may implement MIMO technology. Thus, the eNode-B 160a, for example, may use multiple antennas to transmit wireless signals to, and/or receive wireless signals from, the WTRU 102a.

Each of the eNode-Bs 160a, 160b, 160c may be associated with a particular cell (not shown) and may be configured to handle radio resource management decisions, handover decisions, scheduling of users in the UL and/or DL, and the like. As shown in FIG. 1C, the eNode-Bs 160a, 160b, 160c may communicate with one another over an X2 interface.

The CN 106 shown in FIG. 1C may include a mobility management entity (MME) 162, a serving gateway (SGW) 164, and a packet data network (PDN) gateway (or PGW) 166. While each of the foregoing elements are depicted as part of the CN 106, it will be appreciated that any of these elements may be owned and/or operated by an entity other than the CN operator.

The MME 162 may be connected to each of the eNode-Bs 160a, 160b, 160c in the RAN 104 via an S1 interface and may serve as a control node. For example, the MME 162 may be responsible for authenticating users of the WTRUs 102a, 102b, 102c, bearer activation/deactivation, selecting a particular serving gateway during an initial attach of the WTRUs 102a, 102b, 102c, and the like. The MME 162 may provide a control plane function for switching between the RAN 104 and other RANs (not shown) that employ other radio technologies, such as GSM and/or WCDMA.

The SGW 164 may be connected to each of the eNode Bs 160a, 160b, 160c in the RAN 104 via the S1 interface. The SGW 164 may generally route and forward user data packets to/from the WTRUs 102a, 102b, 102c. The SGW 164 may perform other functions, such as anchoring user planes during inter-eNode B handovers, triggering paging when DL data is available for the WTRUs 102a, 102b, 102c, managing and storing contexts of the WTRUs 102a, 102b, 102c, and the like.

The SGW 164 may be connected to the PGW 166, which may provide the WTRUs 102a, 102b, 102c with access to packet-switched networks, such as the Internet 110, to facilitate communications between the WTRUs 102a, 102b, 102c and IP-enabled devices.

The CN 106 may facilitate communications with other networks. For example, the CN 106 may provide the WTRUs 102a, 102b, 102c with access to circuit-switched networks, such as the PSTN 108, to facilitate communications between the WTRUs 102a, 102b, 102c and traditional land-line communications devices. For example, the CN 106 may include, or may communicate with, an IP gateway (e.g., an IP multimedia subsystem (IMS) server) that serves as an interface between the CN 106 and the PSTN 108. In addition, the CN 106 may provide the WTRUs 102a, 102b, 102c with access to the other networks 112, which may include other wired and/or wireless networks that are owned and/or operated by other service providers.

Although the WTRU is described in FIGS. 1A-1D as a wireless terminal, it is contemplated that in certain representative embodiments that such a terminal may use (e.g., temporarily or permanently) wired communication interfaces with the communication network.

In some representative embodiments, the other network 112 may be a WLAN.

A WLAN in Infrastructure Basic Service Set (BSS) mode may have an Access Point (AP) for the BSS and one or more stations (STAs) associated with the AP. The AP may have an access or an interface to a Distribution System (DS) or another type of wired/wireless network that carries traffic in to and/or out of the BSS. Traffic to STAs that originates from outside the BSS may arrive through the AP and may be delivered to the STAs. Traffic originating from STAs to destinations outside the BSS may be sent to the AP to be delivered to respective destinations. Traffic between STAs within the BSS may be sent through the AP, for example, where the source STA may send traffic to the AP and the AP may deliver the traffic to the destination STA. The traffic between STAs within a BSS may be considered and/or referred to as peer-to-peer traffic. The peer-to-peer traffic may be sent between (e.g., directly between) the source and destination STAs with a direct link setup (DLS). In certain representative embodiments, the DLS may use an 802.11e DLS or an 802.11z tunneled DLS (TDLS). A WLAN using an Independent BSS (IBSS) mode may not have an AP, and the STAs (e.g., all of the STAs) within or using the IBSS may communicate directly with each other. The IBSS mode of communication may sometimes be referred to herein as an "ad-hoc" mode of communication.

When using the 802.11ac infrastructure mode of operation or a similar mode of operations, the AP may transmit a beacon on a fixed channel, such as a primary channel. The primary channel may be a fixed width (e.g., 20 MHz wide bandwidth) or a dynamically set width via signaling. The primary channel may be the operating channel of the BSS and may be used by the STAs to establish a connection with the AP. In certain representative embodiments, Carrier Sense Multiple Access with Collision Avoidance (CSMA/CA) may be implemented, for example in in 802.11 systems. For CSMA/CA, the STAs (e.g., every STA), including the AP, may sense the primary channel. If the primary channel is sensed/detected and/or determined to be busy by a particular STA, the particular STA may back off. One STA (e.g., only one station) may transmit at any given time in a given BSS.

High Throughput (HT) STAs may use a 40 MHz wide channel for communication, for example, via a combination of the primary 20 MHz channel with an adjacent or nonadjacent 20 MHz channel to form a 40 MHz wide channel.

Very High Throughput (VHT) STAs may support 20 MHz, 40 MHz, 80 MHz, and/or 160 MHz wide channels. The 40 MHz, and/or 80 MHz, channels may be formed by combining contiguous 20 MHz channels. A 160 MHz channel may be formed by combining 8 contiguous 20 MHz channels, or by combining two non-contiguous 80 MHz channels, which may be referred to as an 80+80 configuration. For the 80+80 configuration, the data, after channel encoding, may be passed through a segment parser that may divide the data into two streams. Inverse Fast Fourier Transform (IFFT) processing, and time domain processing, may be done on each stream separately. The streams may be mapped on to the two 80 MHz channels, and the data may be transmitted by a transmitting STA. At the receiver of the receiving STA, the above-described operation for the 80+80 configuration may be reversed, and the combined data may be sent to the Medium Access Control (MAC).

Sub 1 GHz modes of operation are supported by 802.11af and 802.11ah. The channel operating bandwidths, and carriers, are reduced in 802.11af and 802.11ah relative to those used in 802.11n, and 802.11ac. 802.11af supports 5 MHz, 10 MHz and 20 MHz bandwidths in the TV White Space (TVWS) spectrum, and 802.11ah supports 1 MHz, 2 MHz, 4 MHz, 8 MHz, and 16 MHz bandwidths using non-TVWS spectrum. According to a representative embodiment, 802.11ah may support Meter Type Control/Machine-Type Communications, such as MTC devices in a macro coverage area. MTC devices may have certain capabilities, for example, limited capabilities including support for (e.g., only support for) certain and/or limited bandwidths. The MTC devices may include a battery with a battery life above a threshold (e.g., to maintain a very long battery life).

WLAN systems, which may support multiple channels, and channel bandwidths, such as 802.11n, 802.11ac, 802.11af, and 802.11ah, include a channel which may be designated as the primary channel. The primary channel may have a bandwidth equal to the largest common operating bandwidth supported by all STAs in the BSS. The bandwidth of the primary channel may be set and/or limited by a STA, from among all STAs in operating in a BSS, which supports the smallest bandwidth operating mode. In the example of 802.11ah, the primary channel may be 1 MHz wide for STAs (e.g., MTC type devices) that support (e.g., only support) a 1 MHz mode, even if the AP, and other STAs in the BSS support 2 MHz, 4 MHz, 8 MHz, 16 MHz, and/or other channel bandwidth operating modes. Carrier sensing and/or Network Allocation Vector (NAV) settings may depend on the status of the primary channel. If the primary channel is busy, for example, due to a STA (which supports only a 1 MHz operating mode), transmitting to the AP, the entire available frequency bands may be considered busy even though a majority of the frequency bands remains idle and may be available.

In the United States, the available frequency bands, which may be used by 802.11ah, are from 902 MHz to 928 MHz. In Korea, the available frequency bands are from 917.5 MHz to 923.5 MHz. In Japan, the available frequency bands are from 916.5 MHz to 927.5 MHz. The total bandwidth available for 802.11ah is 6 MHz to 26 MHz depending on the country code.

Figure 1D:
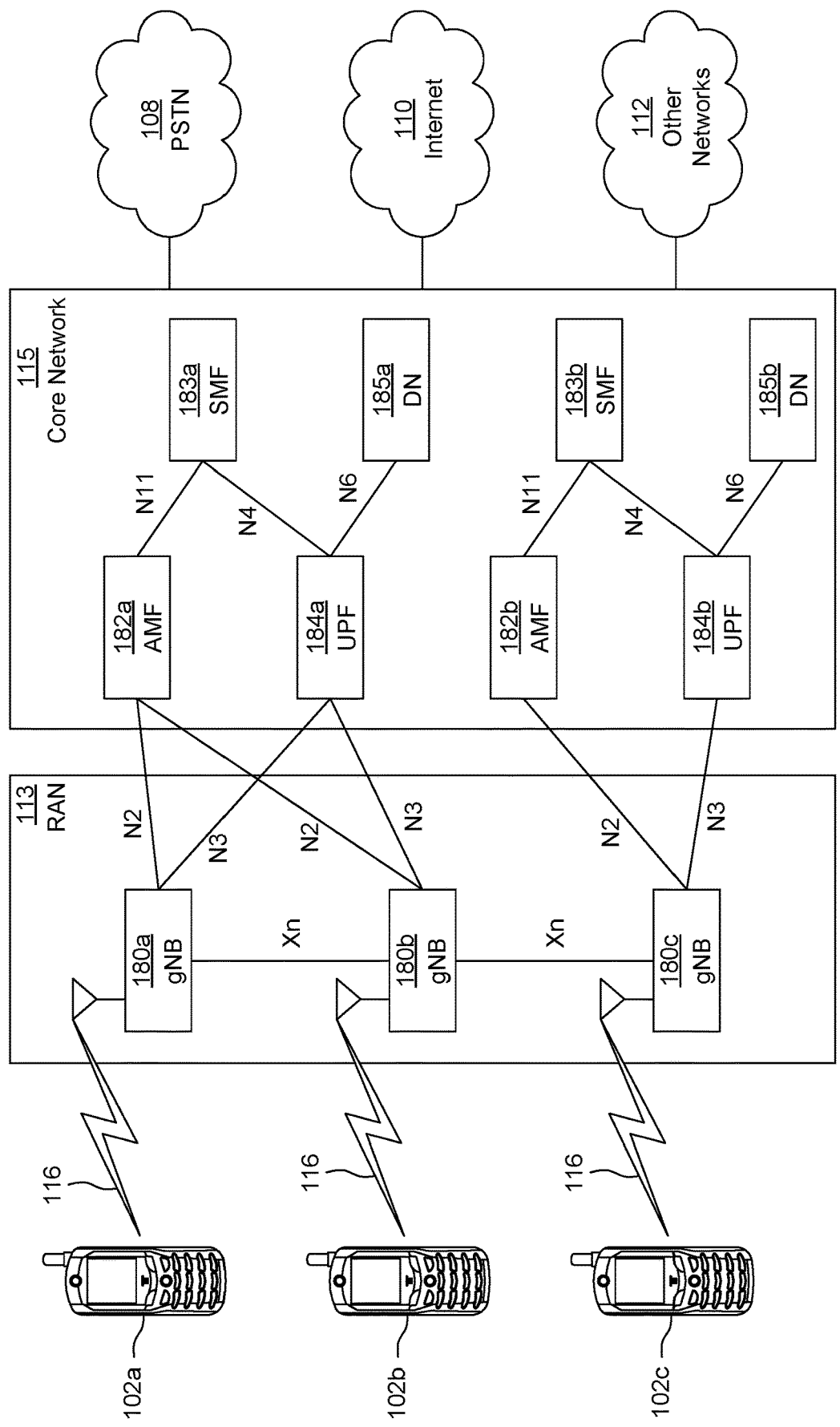
FIG. 1D is a system diagram illustrating a further example RAN and a further example CN that may be used within the communications system illustrated in FIG. 1A according to an embodiment.

FIG. 1D is a system diagram illustrating the RAN 113 and the CN 115 according to an embodiment. As noted above, the RAN 113 may employ an NR radio technology to communicate with the WTRUs 102a, 102b, 102c over the air interface 116. The RAN 113 may also be in communication with the CN 115.

The RAN 113 may include gNBs 180a, 180b, 180c, though it will be appreciated that the RAN 113 may include any number of gNBs while remaining consistent with an embodiment. The gNBs 180a, 180b, 180c may each include one or more transceivers for communicating with the WTRUs 102a, 102b, 102c over the air interface 116. In one embodiment, the gNBs 180a, 180b, 180c may implement MIMO technology. For example, gNBs 180a, 108b may utilize beamforming to transmit signals to and/or receive signals from the gNBs 180a, 180b, 180c. Thus, the gNB 180a, for example, may use multiple antennas to transmit wireless signals to, and/or receive wireless signals from, the WTRU 102a. In an embodiment, the gNBs 180a, 180b, 180c may implement carrier aggregation technology. For example, the gNB 180a may transmit multiple component carriers to the WTRU 102a (not shown). A subset of these component carriers may be on unlicensed spectrum while the remaining component carriers may be on licensed spectrum. In an embodiment, the gNBs 180a, 180b, 180c may implement Coordinated Multi-Point (CoMP) technology. For example, WTRU 102a may receive coordinated transmissions from gNB 180a and gNB 180b (and/or gNB 180c).

The WTRUs 102a, 102b, 102c may communicate with gNBs 180a, 180b, 180c using transmissions associated with a scalable numerology. For example, the OFDM symbol spacing and/or OFDM subcarrier spacing may vary for different transmissions, different cells, and/or different portions of the wireless transmission spectrum. The WTRUs 102a, 102b, 102c may communicate with gNBs 180a, 180b, 180c using subframe or transmission time intervals (TTIs) of various or scalable lengths (e.g., containing varying number of OFDM symbols and/or lasting varying lengths of absolute time).

The gNBs 180a, 180b, 180c may be configured to communicate with the WTRUs 102a, 102b, 102c in a standalone configuration and/or a non-standalone configuration. In the standalone configuration, WTRUs 102a, 102b, 102c may communicate with gNBs 180a, 180b, 180c without also accessing other RANs (e.g., such as eNode-Bs 160a, 160b, 160c). In the standalone configuration, WTRUs 102a, 102b, 102c may utilize one or more of gNBs 180a, 180b, 180c as a mobility anchor point. In the standalone configuration, WTRUs 102a, 102b, 102c may communicate with gNBs 180a, 180b, 180c using signals in an unlicensed band. In a non-standalone configuration WTRUs 102a, 102b, 102c may communicate with/connect to gNBs 180a, 180b, 180c while also communicating with/connecting to another RAN such as eNode-Bs 160a, 160b, 160c. For example, WTRUs 102a, 102b, 102c may implement DC principles to communicate with one or more gNBs 180a, 180b, 180c and one or more eNode-Bs 160a, 160b, 160c substantially simultaneously. In the non-standalone configuration, eNode-Bs 160a, 160b, 160c may serve as a mobility anchor for WTRUs 102a, 102b, 102c and gNBs 180a, 180b, 180c may provide additional coverage and/or throughput for servicing WTRUs 102a, 102b, 102c.

Each of the gNBs 180a, 180b, 180c may be associated with a particular cell (not shown) and may be configured to handle radio resource management decisions, handover decisions, scheduling of users in the UL and/or DL, support of network slicing, dual connectivity, interworking between NR and E-UTRA, routing of user plane data towards User Plane Function (UPF) 184a, 184b, routing of control plane information towards Access and Mobility Management Function (AMF) 182a, 182b and the like. As shown in FIG. 1D, the gNBs 180a, 180b, 180c may communicate with one another over an Xn interface.

The CN 115 shown in FIG. 1D may include at least one AMF 182a, 182b, at least one UPF 184a,184b, at least one Session Management Function (SMF) 183a, 183b, and possibly a Data Network (DN) 185a, 185b. While each of the foregoing elements are depicted as part of the CN 115, it will be appreciated that any of these elements may be owned and/or operated by an entity other than the CN operator.

The AMF 182a, 182b may be connected to one or more of the gNBs 180a, 180b, 180c in the RAN 113 via an N2 interface and may serve as a control node. For example, the AMF 182a, 182b may be responsible for authenticating users of the WTRUs 102a, 102b, 102c, support for network slicing (e.g., handling of different PDU sessions with different requirements), selecting a particular SMF 183a, 183b, management of the registration area, termination of NAS signaling, mobility management, and the like. Network slicing may be used by the AMF 182a, 182b in order to customize CN support for WTRUs 102a, 102b, 102c based on the types of services being utilized WTRUs 102a, 102b, 102c. For example, different network slices may be established for different use cases such as services relying on ultra-reliable low latency (URLLC) access, services relying on enhanced massive mobile broadband (eMBB) access, services for machine-type communication (MTC) access, and/or the like. The AMF 182 may provide a control plane function for switching between the RAN 113 and other RANs (not shown) that employ other radio technologies, such as LTE, LTE-A, LTE-A Pro, and/or non-3GPP access technologies such as WiFi.

The SMF 183a, 183b may be connected to an AMF 182a, 182b in the CN 115 via an N11 interface. The SMF 183a, 183b may also be connected to a UPF 184a, 184b in the CN 115 via an N4 interface. The SMF 183a, 183b may select and control the UPF 184a, 184b and configure the routing of traffic through the UPF 184a, 184b. The SMF 183a, 183b may perform other functions, such as managing and allocating a WTRU or UE IP address, managing PDU sessions, controlling policy enforcement and QoS, providing downlink data notifications, and the like. A PDU session type may be IP-based, non-IP based, Ethernet-based, and the like.

The UPF 184a, 184b may be connected to one or more of the gNBs 180a, 180b, 180c in the RAN 113 via an N3 interface, which may provide the WTRUs 102a, 102b, 102c with access to packet-switched networks, such as the Internet 110, to facilitate communications between the WTRUs 102a, 102b, 102c and IP-enabled devices. The UPF 184, 184b may perform other functions, such as routing and forwarding packets, enforcing user plane policies, supporting multi-homed PDU sessions, handling user plane QoS, buffering downlink packets, providing mobility anchoring, and the like.

The CN 115 may facilitate communications with other networks. For example, the CN 115 may include, or may communicate with, an IP gateway (e.g., an IP multimedia subsystem (IMS) server) that serves as an interface between the CN 115 and the PSTN 108. In addition, the CN 115 may provide the WTRUs 102a, 102b, 102c with access to the other networks 112, which may include other wired and/or wireless networks that are owned and/or operated by other service providers. In one embodiment, the WTRUs 102a, 102b, 102c may be connected to a local Data Network (DN) 185a, 185b through the UPF 184a, 184b via the N3 interface to the UPF 184a, 184b and an N6 interface between the UPF 184a, 184b and the DN 185a, 185b.

In view of FIGS. 1A-1D, and the corresponding description of FIGS. 1A-1D, one or more, or all, of the functions described herein with regard to one or more of: WTRU 102a-d, Base Station 114a-b, eNode-B 160a-c, MME 162, SGW 164, PGW 166, gNB 180a-c, AMF 182a-b, UPF 184a-b, SMF 183a-b, DN 185a-b, and/or any other device (s) described herein, may be performed by one or more emulation devices (not shown). The emulation devices may be one or more devices configured to emulate one or more, or all, of the functions described herein. For example, the emulation devices may be used to test other devices and/or to simulate network and/or WTRU functions.

The emulation devices may be designed to implement one or more tests of other devices in a lab environment and/or in an operator network environment. For example, the one or more emulation devices may perform the one or more, or all, functions while being fully or partially implemented and/or deployed as part of a wired and/or wireless communication network in order to test other devices within the communication network. The one or more emulation devices may perform the one or more, or all, functions while being temporarily implemented/deployed as part of a wired and/or wireless communication network. The emulation device may be directly coupled to another device for purposes of testing and/or may performing testing using over-the-air (OTA) wireless communications.

The one or more emulation devices may perform the one or more, including all, functions while not being implemented/deployed as part of a wired and/or wireless communication network. For example, the emulation devices may be utilized in a testing scenario in a testing laboratory and/or a non-deployed (e.g., testing) wired and/or wireless communication network in order to implement testing of one or more components. The one or more emulation devices may be test equipment. Direct RF coupling and/or wireless communications via RF circuitry (e.g., which may include one or more antennas) may be used by the emulation devices to transmit and/or receive data.

Embodiments disclosed herein generally relate to communication networks, wireless and/or wired. For example, one or more embodiments disclosed herein are related to methods, apparatus, and procedures for polar encoding and decoding, including cyclic redundancy check (CRC) aided encoding and/or Belief Propagation (BP) decoding for polar codes in wireless communications.

Polar Code(s)

New Radio (NR) technology may support and/or serve one or more services to one or multiple WTRUs. Such services may be varying and/or different latency and reliability requirements. Examples of the services that NR technology may support include URLLC and/or eMBB services. To better support operations with different types of services, such as URLLC and eMBB, mechanisms and procedures are desired to enable enhanced coding and decoding for wireless communications.

Polar code is the first channel code analytically proved to be capacity achieving. Polar codes show comparable performance to conventional low-density parity-check (LDPC) code or turbo code, having low or no error floor when aided by the embedded cyclic redundancy check (CRC) particularly for small to medium block lengths. Polar codes with successive cancellation decoding require relatively low encoding and decoding complexities. However, the decoding complexity increases in proportion to the list-size when the CRC-aided list decoding is adopted as well as the block-length of the codeword. The increased complexity becomes a key issue particularly in medium to large block-lengths, and limits the adoption of polar codes for high throughput regime including, for example, 5G NR eMBB data rates (~20 Gbps) and above.

Polar codes have superior performance in small block lengths, therefore polar codes are adopted as a channel coding scheme, for example, by 3GPP standards, to be used for control channel forward error correction (FEC) operations.

In an example, Polar code encoding can be defined as in the following:

$$c_1^N = u_1^N G_N \quad \text{Equation 1}$$

The codeword vector of polar code $c_1^N$ is generated by the product of the input vector $u_1^N$ and generator matrix $G_N \cdot c_1^N$ and $u_1^N$ are binary vectors with length $N=2^n$, where N denotes the codeword block-length. The generator matrix $G_N$ can be defined by the Kronecker power of $$F = \begin{bmatrix} 1 & 0 \\ 1 & 1 \end{bmatrix},$$

$$G_N = F^{\otimes n} \quad \text{Equation 2}$$

where $(\ )^{\otimes n}$ stands for n-th Kronecker power of $(\ )$. In Arikan's original paper, $G_N = B_N F^{\otimes n}$, where $B_N$ denotes the bit reversing matrix and it changes the order of elements in $u_1^N = [u_1, u_2, \ldots, u_N]$. The bit reversing operation will be described in the later section.

In this disclosure, without loss of generality, it is assumed that $G_N = F^{\otimes n}$ unless there is an additional note. Some input bits for polar code may have a fixed value (e.g., zero), and these input bits are called "frozen bits". The input indexes for frozen bits can be represented by the set $A^c = \{a_1^c, a_2^c, a_3^c, \ldots, a_{N-K}^c\}$ and $a_i^c < a_j^c$ if $i < j$. The remaining part of input bits for polar code can convey variable information bits and may be called "unfrozen bits". The input indexes for unfrozen bits can be represented by the set $A = \{a_1, a_2, a_3 \ldots, a_K\}$ and $a_i < a_j$ if $i < j$. The number of information bits (or unfrozen bits) is defined as K and the number of frozen bits is N−K. The code rate R of polar code can be defined as $$\frac{K}{N}.$$

The determination process of input bit indexes for frozen bits and unfrozen bits is called as "code construction" for polar code(s).

Figure 2:
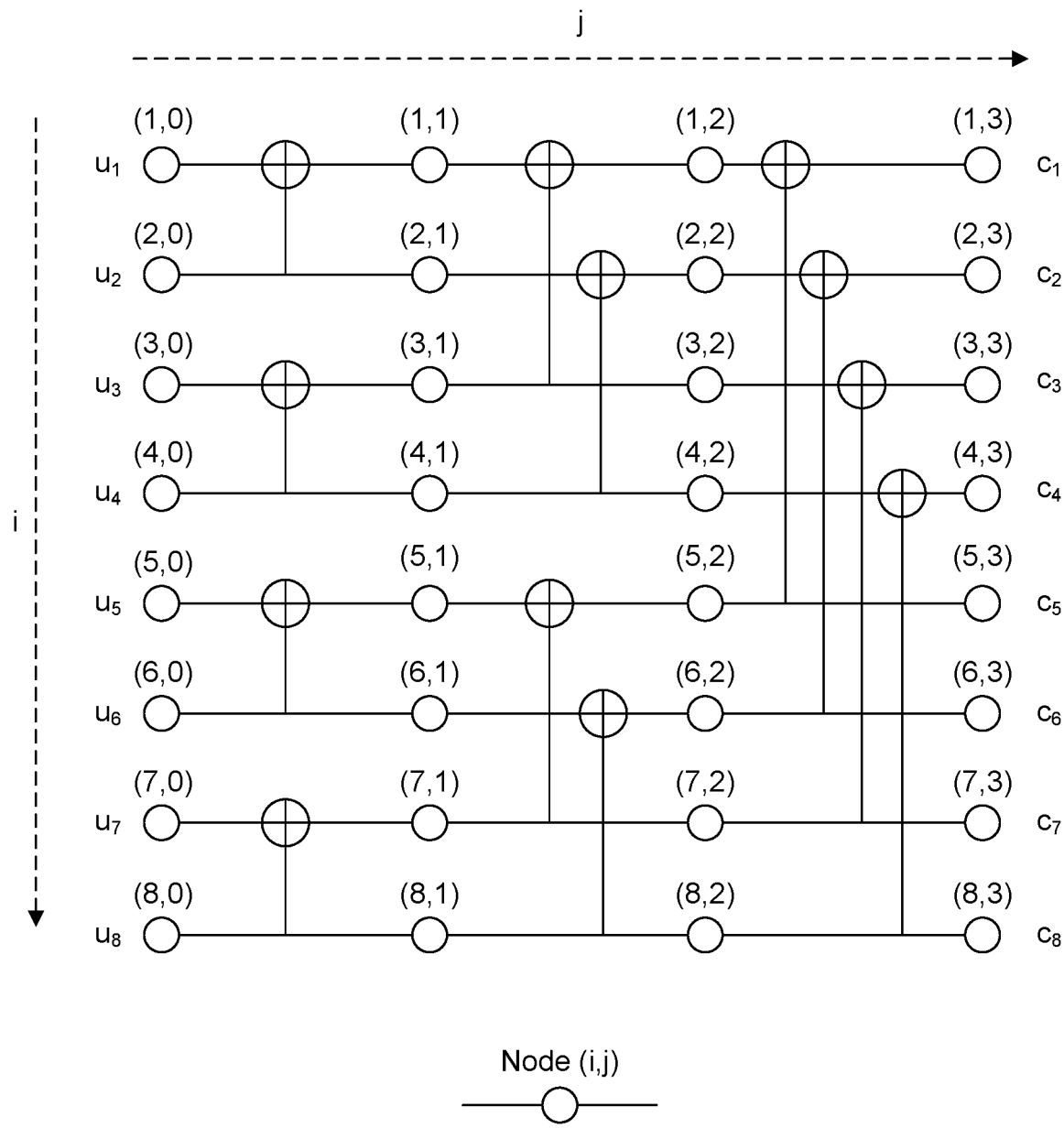
FIG. 2 is a diagram illustrating an example of Polar encoder with N=8, according to one or more embodiments.

In some current implementations, there are several code construction methods developed for polar codes. In some examples, these methods initially calculate the reliability of each input bit index, and therefore have an order of bit index reliabilities before starting any encoding operation. From the obtained reliability order, the least reliable input bits are assigned as frozen bits and the remaining bits are assigned as unfrozen/information bits. The proportion of frozen and unfrozen bits are determined according to the desired code rate. With the frozen and unfrozen bit locations available, the encoding operation follows as in $c_1^N = u_1^N G_N$ Equation) and as shown in FIG. 2. In various examples, when FIG. 2 is referred in this document, these examples may be considered as following the polar code description in 3GPP NR standards. As the example shown in FIG. 2, the polar encoder may be represented by the nodes, where the nodes can be denoted by (i,j), i=1, . . . , N and j=0, . . . , n.

Same state-of-the-art decoding algorithms for polar code may be categorized into two algorithms, 1) Successive Cancellation (SC)-based decoding algorithm, and 2) Belief Propagation (BP)-based decoding algorithm. SC polar decoding is a sequential decoding method to calculate Log-Likelihood Ratio (LLR) value of input bits in a serial manner. It is based on the assumption that the previously decoded bits are correct, and the previously decoded bits are used for decoding current bit(s). Successive Cancellation List (SCL) decoding adopts several lists of candidate paths to improve the performance of SC decoding. The best list is selected according to the outcome of the LLR calculation. CRC-Aided Successive Cancellation List (CA-SCL) decoding adopts the embedded CRC as a tool to select the list. By CA-SCL decoding, polar code can achieve error performance comparable or superior to conventional LDPC code or turbo code.

Belief Propagation (BP) Decoding of Polar Code(s)

Figure 3:
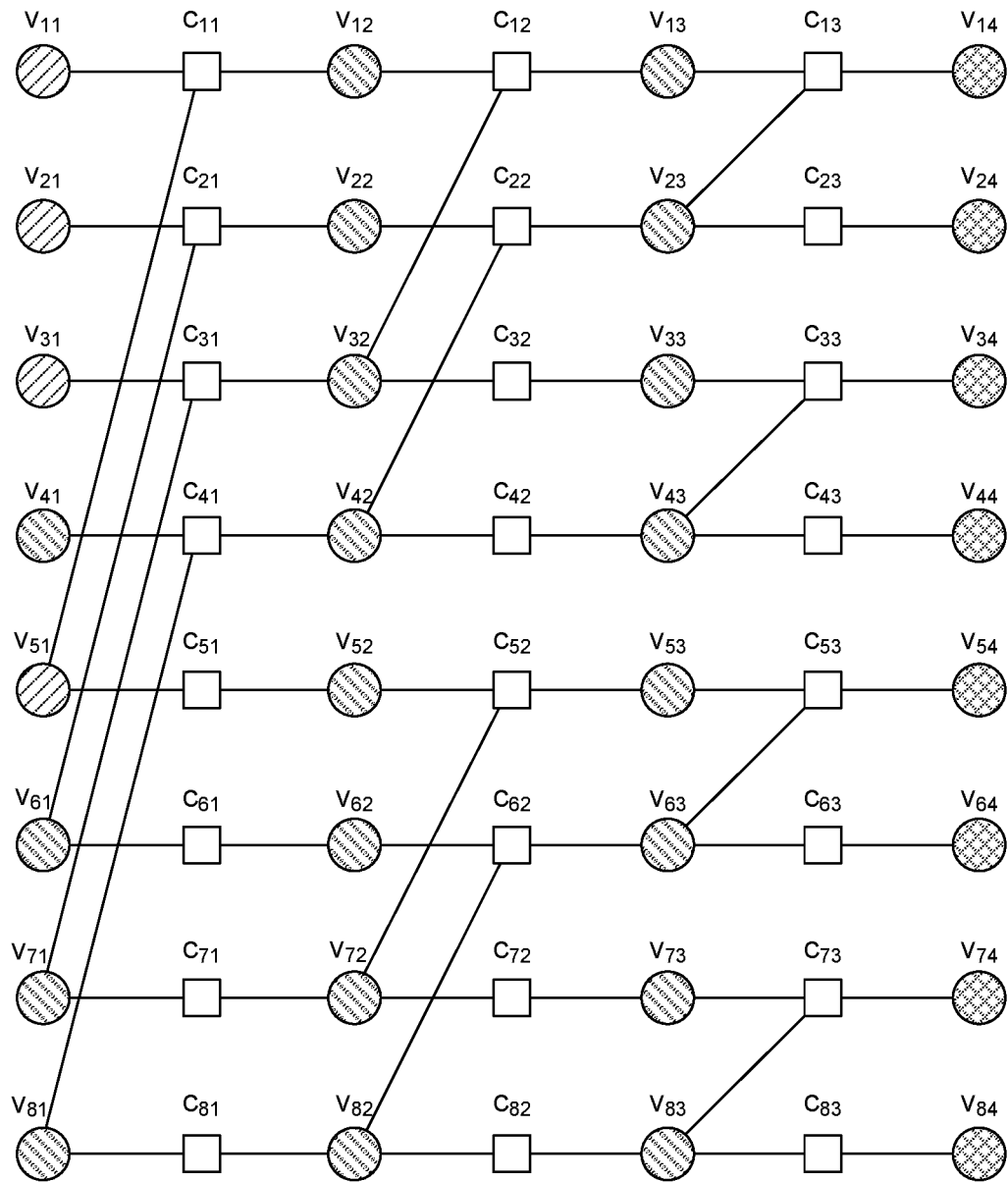
FIG. 3 is a diagram illustrating an example of a factor graph for BP decoding (N=8), according to one or more embodiments.

Belief Propagation (BP) is a technique that is widely used in decoding of various code-classes, including LDPC codes. Applications of BP-based decoding (i.e., BP decoding) for polar codes have been proposed or used in some implementations. An improved method is denoted as LDPC-like decoding, where conventional BP decoding procedures are modified based on the features utilized in LDPC codes. Specifically, the factor graph may be pruned to have a simpler and lower complexity configuration in order to adopt the LDPC decoding characteristics. Factor graph is a bipartite graph and consists of two types of nodes denoted as variable nodes and check nodes, respectively. FIG. 3 depicts the factor graph of polar codes for $N=2^n=2^3=8$. The factor graph has n+1 levels (e.g., stages) similar to the polar encoder as shown in FIG. 2. In FIG. 3, the circles indicate variable nodes, and the squares indicate check nodes. In the leftmost level (level 0) of the factor graph, the variable nodes represent the input bits, whereas in the rightmost level (level n), the variable nodes represent the output bits. Some input variable nodes stand for frozen bits. The input nodes (or input bits) are bit reversed and result in a different sequence compared with the inputs in FIG. 2 (e.g., a bit-reversal operation).

A decoding algorithm by message passing for the factor graph (e.g., as shown in FIG. 3) may be performed in an iterative manner. In some examples, one iteration step may be divided into two half iteration steps. In an example, once a round-trip scheduling is assumed or used (this configuration of half iteration follows the rule of round-trip scheduling and other scheduling(s) may be used), the first half iteration initially calculates metrics (e.g., LLR values) based on Equations 3 and/or 4, and starts from the rightmost nodes (e.g., codeword variable nodes) and continues with the same metric calculations (Equations 3 and/or 4), until it reaches the leftmost nodes (e.g., input bit nodes). On the other hand, the second half iteration performs metric (e.g., LLR values) calculations based on Equation 5 and/or 6 starting from the leftmost nodes until reaching the rightmost nodes.

$$L_{i,j} = G(L_{i,j+1}, L_{i+2^j,j+1} + R_{i+2^j,j}) \quad \text{Equation 3}$$

$$L_{i+2^j,j} = G(R_{i,j}, L_{i,j+1}) + L_{i+2^j,j+1} \quad \text{Equation 4}$$

$$R_{i,j+1} = G(R_{i,j}, L_{i+2^j,j+1} + R_{i+2^j,j}) \quad \text{Equation 5}$$

$$R_{i+2^j,j+1} = G(R_{i,j}, L_{i,j+1}) + R_{i+2^j,j} \quad \text{Equation 6}$$

where $G(x,y)=\text{sgn}(x)\text{sgn}(y)\min(|x|,|y|)$ and sgn(x) is sign of x. When $x \geq 0$, sgn(x)=1 and When x<0, sgn(x)=−1. |x| is the absolute value of x.

Figure 4:
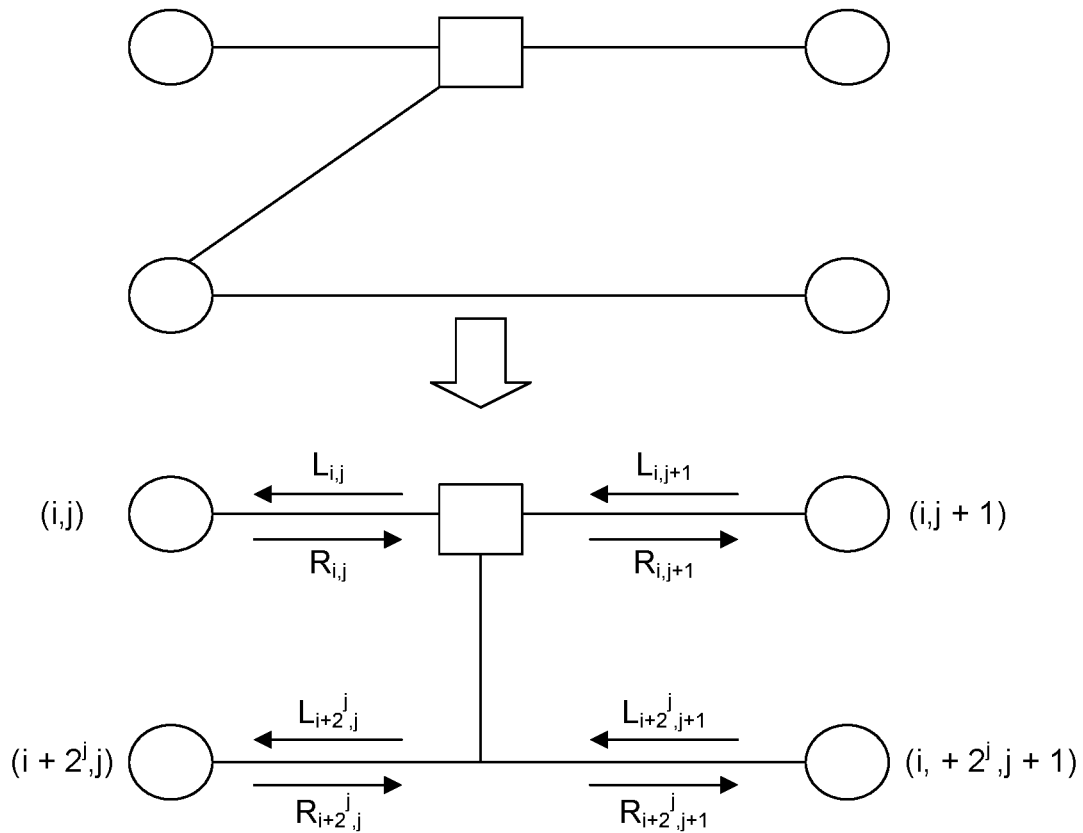
FIG. 4 is a diagram illustrating an example of LLR message passing for BP decoding, according to one or more embodiments.

The BP decoding algorithm based on the above equations can be defined as min-sum (MS) algorithm. G(x,y) can be modified as $G(x,y)=\alpha \cdot \text{sgn}(x)\text{sgn}(y)\min(|x|,|y|)$ where $\alpha$ is defined as a scaling factor and $\alpha<1$. By adding $\alpha$, the BP decoding algorithm is called as a scaled min-sum (SMS) algorithm, and it can provide better performance and/or less latency depending on $\alpha$ in some cases. The metric (e.g., LLR values) calculations and their relationships between the nodes can be observed in FIG. 4.

Relaxed Polar Code(s)

Figure 5:
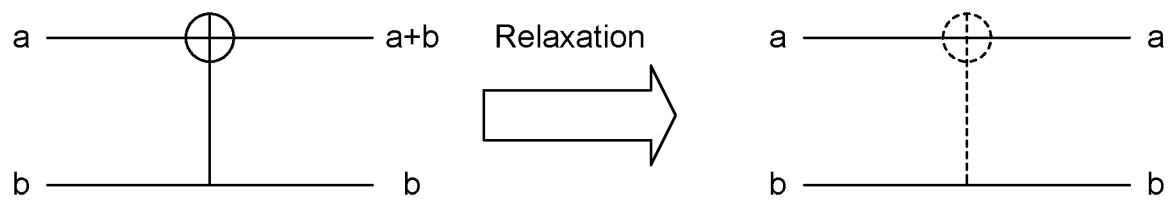
FIG. 5 is a diagram illustrating an example of a relaxation operation, according to one or more embodiments.

One approach used in reducing the complexity of encoding and/or decoding operations of polar codes is called relaxation. The relaxation for polar codes means that parts of polarization process in polar codes are omitted. The polarization process corresponds to "XOR" operation in polar encoding and the relaxation is done by omitting the "XOR" operation in some parts (a subset) of polar encoding. An example of this relaxation is illustrated in FIG. 5.

When decoding the relaxed polar code(s), the corresponding decoding process to "XOR" operation may be not performed. This also provides decoding complexity reduction. All decoding algorithms developed for conventional polar decoding including, for example, SC, SCL, CA-SCL, and/or BP decoding may be used equivalently with reduced decoding complexity. In case of BP decoding, the Equation 3, 4, 5, and/or 6 may be modified for the relaxed nodes as below equations:

$$L_{i,j}=L_{i,j+1} \quad \text{Equation 11}$$

$$L_{i+2^j,j}=L_{i+2^j,j+1} \quad \text{Equation 12}$$

$$R_{i,j+1}=R_{i,j} \quad \text{Equation 13}$$

$$R_{i+2^j,j+1}=R_{i+2^j,j} \quad \text{Equation 14}$$

In some examples, the relaxation schemes may provide a reduction of complexity and latency in both encoding and decoding, in addition to performance improvement with proper selection of relaxed nodes. The relaxation schemes for polar codes are introduced in some current implementations. These relaxation schemes are based on a calculation of error probability in each node in a polar encoding operation (e.g., as shown in FIG. 2), for example, corresponding to nN nodes in total and their error probability calculation(s).

Polar codes were adopted as control channel coding scheme for New Radio (NR) and may be used for high throughput data communications. In some implementations, when using polar codes for high data rate communications, the latency caused by the sequential nature of SC-based decoding may need to be considered. The BP decoding, along with specialized designs in SC decoders, is one candidate to improve the latency aspect of polar decoding by its highly parallel structure of implementation. Moreover, CRC is a fundamental element of channel coding and improves error correction performance when used in a concatenated coding scheme. CRC has been standardized in various cellular/wireless standards (e.g., 3GPP standards).

However, some enhancements for polar coding and/or BP decoding may be desired. For example, the error correction performance of the state-of-the-art BP decoders for polar coding may fall behind that of the state-of-the-art SC decoders. In another example, some current CRC procedures of BP decoding for polar codes (which have potential to improve error performance) do not provide sufficient coding gain. In yet another example, some current CRC procedures of BP decoding for polar codes are limited to the CRC check after a hard decision of BP decoding, and therefore limit the coding gain of this additional CRC operation.

Various embodiments disclosed herein provide methods, apparatus, and/or procedures using CRC dependent (or aided) polar encoding and/or CRC aided BP decoding which may improve polar encoding and decoding performance, for example, error correction performance of BP decoders used for wireless communications.

Representative Procedure for CRC Dependent Relaxation for Polar Encoding

In various embodiments, "XOR" (e.g., logical XOR) operations in polar encoding that correspond to the polarization branch (that is one level higher than that of encoding nodes used for creating CRC bits) may be relaxed (e.g., omitted), while short cycles originating from the same CRC in the BP decoder factor graph may be removed. In an example, the position (or index) and layer of encoding node bits may be selected to maximize the number of relaxed polarization branches in the polar encoder while reducing latency. In another example, the position (or index) and layer of encoding node bits may be selected to minimize the number of relaxed polarization branches in the polar encoder while increasing coding gain. In some cases, the encoding node bits (e.g., used for CRC bit creation in a polar encoder) may be selected from an input layer (and/or intermediate layers) of the polar encoding process.

Figure 6:
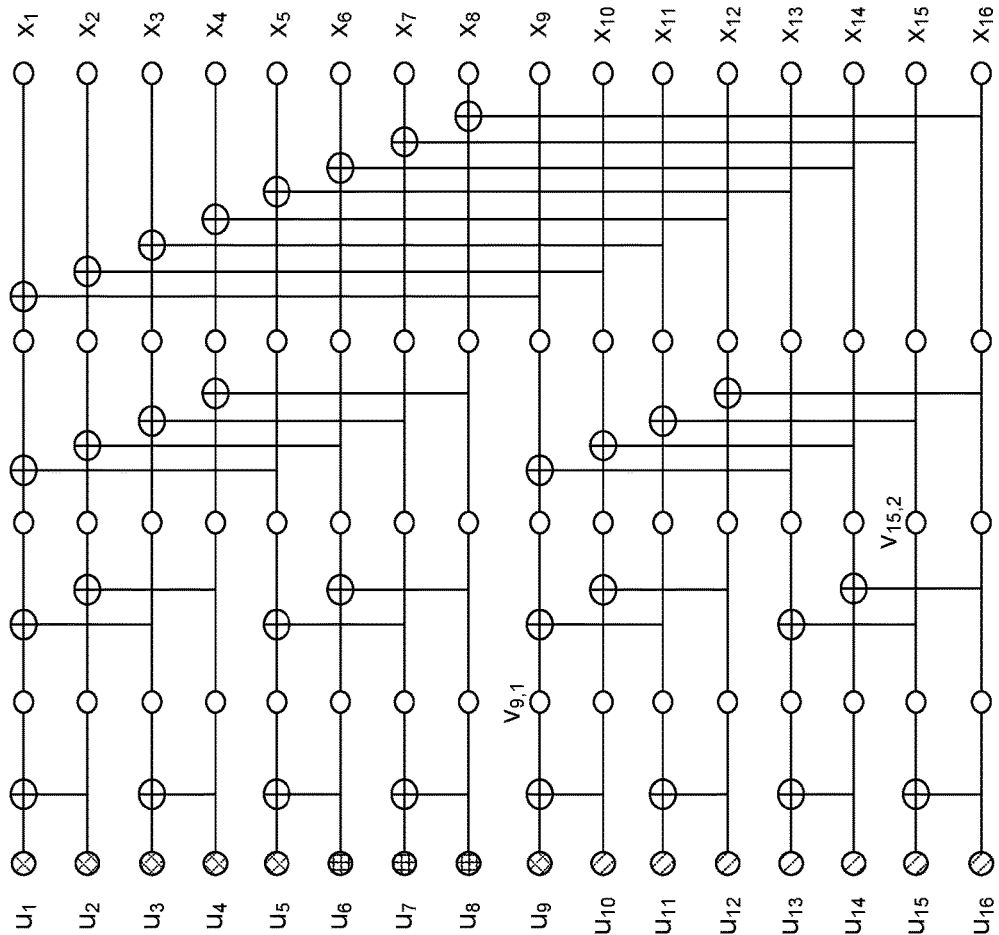
FIG. 6 is a diagram illustrating an example of a conventional polar encoder scheme with CRC, according to one or more embodiments.

Referring to FIG. 6, an example of a conventional polar encoder scheme with CRC is provided, including examples of notation and parameters. In FIG. 6, input node bits to a polar encoder are denoted with $u_i$, i=1, ..., 16, and an intermediate encoding node bit with encoding bit position (or index) i at layer-j is denoted with $v_{i,j}$ (i.e., $v_{i,0}=u_i$).

Figure 7:
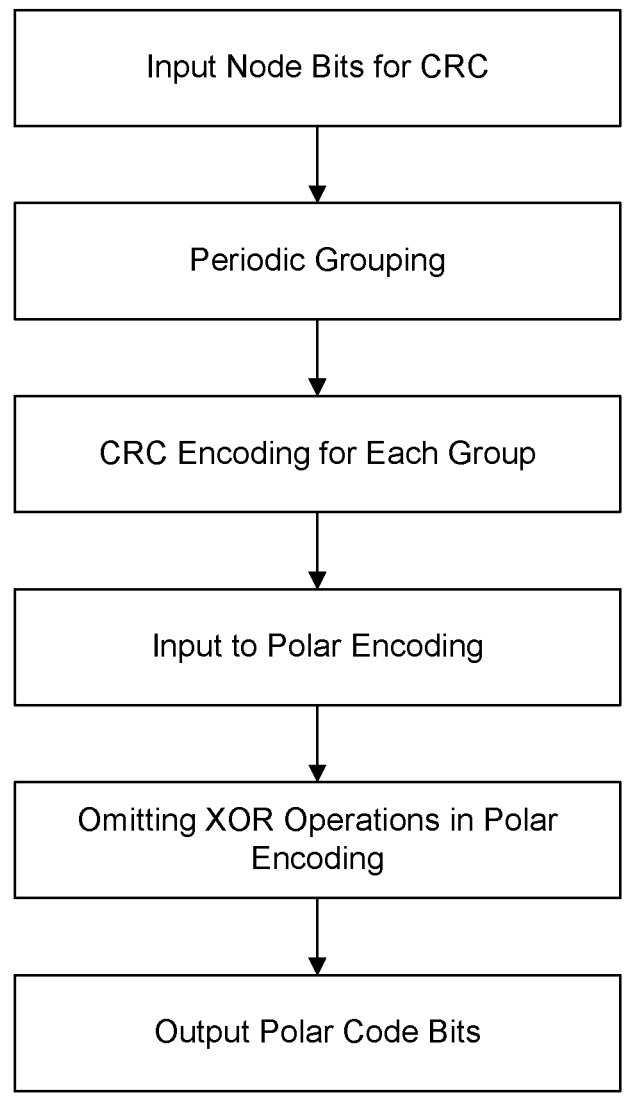
FIG. 7 is a flowchart illustrates an example of a CRC encoding scheme for polar codes, according to one or more embodiments.

Referring to FIG. 7, a flowchart is provided to illustrate an example of a CRC encoding scheme for polar codes (e.g., polar encoding with CRC addition). In this example, the encoding procedure for polar codes may include one or more following operations/processes: input encoding node bits for CRC, periodic grouping, CRC encoding (e.g., CRC encoding for each group), input to polar encoding, relaxation (e.g., omitting XOR operations in polar encoding), and/or output Polar code bits.

i. Input Encoding Node Bits for CRC

In one embodiment, the number of unfrozen bits (including total CRC bits) is K, and C is the total number of CRC bits. The number of information bits is K−C. Let $C_d=\{d_0, d_1, \ldots, d_{M-1}\}$ denote the M encoding node bits that will be used for CRC bit generation. In some examples, M=K−C. These encoding node bits may be selected among input encoding nodes and/or intermediate encoding nodes at any layer of the polar encoder.

The encoding node bits being used (or will be used) for CRC may be selected based on one or more rules. For example, the one or more rules may include any of: 1) the encoding bit position (or index) of node bits for CRC must be greater than those of CRC bits in head position (to ensure loop-free encoding); and/or 2) for each encoding position (or index), only one node for CRC can be selected.

Upon adhering to the one or more rules above, the encoding node bits that being used (or will be used) for CRC may be selected based on one or more operations discussed below.

Figure 8:
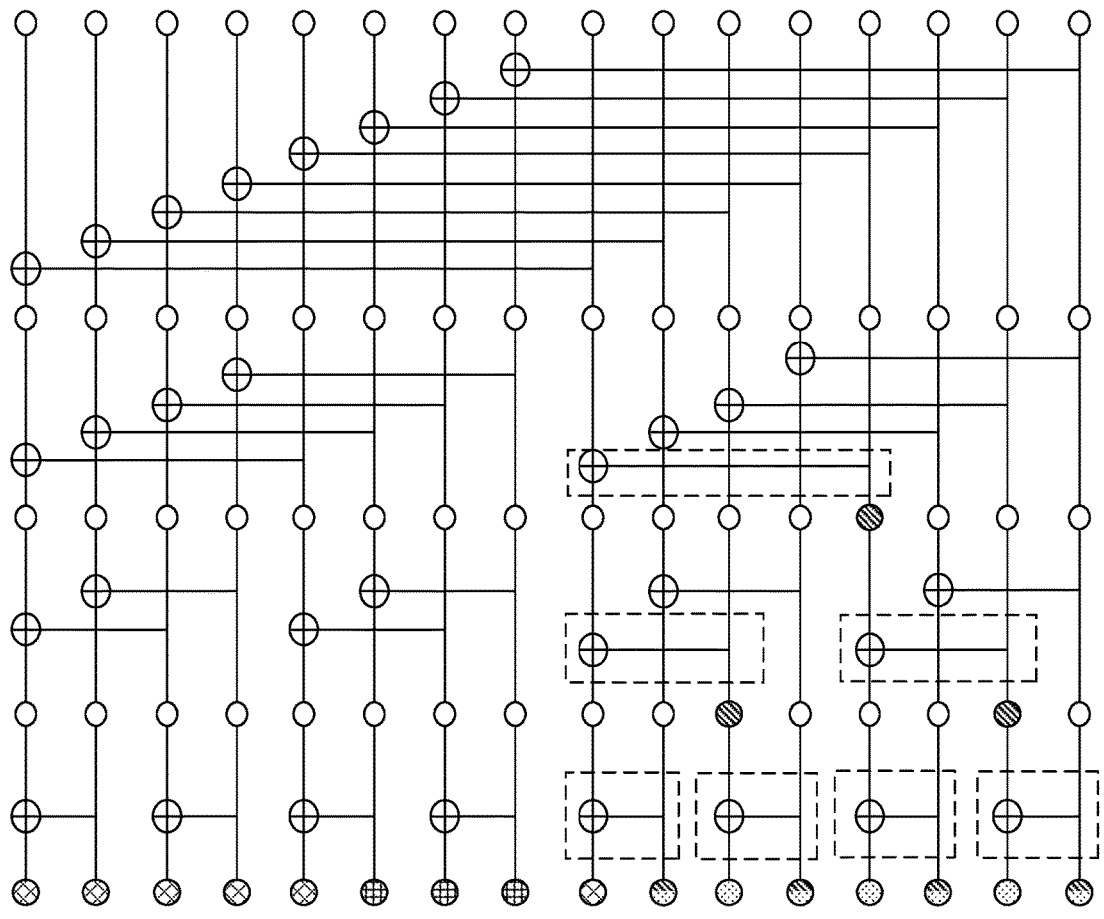
FIG. 8 is a diagram illustrating an example of encoding node selection for CRC using a maximum number of relaxations, according to one or more embodiments.

In various embodiments, the encoding position (or index) and layer of node bits may be selected to maximize the number of relaxed polarization (e.g., XOR) branches in the polar encoder, based on the relaxation rule (e.g., omitting XOR operations in polar encoding as discussed in Operation-v, and/or as shown in the encoding example in FIG. 8). This operation/procedure corresponds to K–C relaxation operations, and may decrease latency. In an example, the maximum number of relaxed branches can be achieved by selecting $v_{i,j}$ nodes based on the following (i,j) pair selection method:

For $j=0, \ldots, n-2$, then $i$: $(i+2^j-1)\%2^{j+1}=0$

As an example, as shown in FIG. 8, the selected nodes for CRC are $v_{10,0}$, $v_{12,0}$, $v_{14,0}$, $v_{16,0}$, $v_{11,1}$, $v_{15,1}$, $v_{13,2}$.

Figure 10:
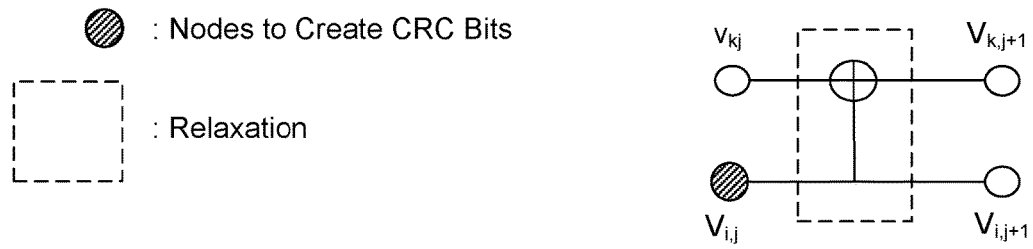
FIG. 10 is a diagram illustrating an example of relaxation rule(s) for polar encoding, according to one or more embodiments.

The number of relaxation paths may be determined dynamically. For example, if lower latency is desired, maximum relaxation operation can be selected, and this corresponds to a set of nodes v_ij for CRC. This maximum relaxation operation may result in K–C relaxations based on the relaxation rule in Operation-v, and/or relaxation rule(s) as shown in FIG. 10. In another example, if increasing coding gain is desired, minimum relaxation operation can be selected, and this corresponds to another set of nodes v_ij for CRC. This minimum relaxation operation may result in one (1) relaxation based on the relaxation rule in Operation-v, and/or relaxation rule(s) as shown in FIG. 10. In some cases, if the number of relaxations is not required, any v_ij nodes for CRC generation can be selected, and the number of relaxations may be determined based on the relaxation rule in Operation-v, and/or relaxation rule(s) as shown in FIG. 10.

Figure 9:
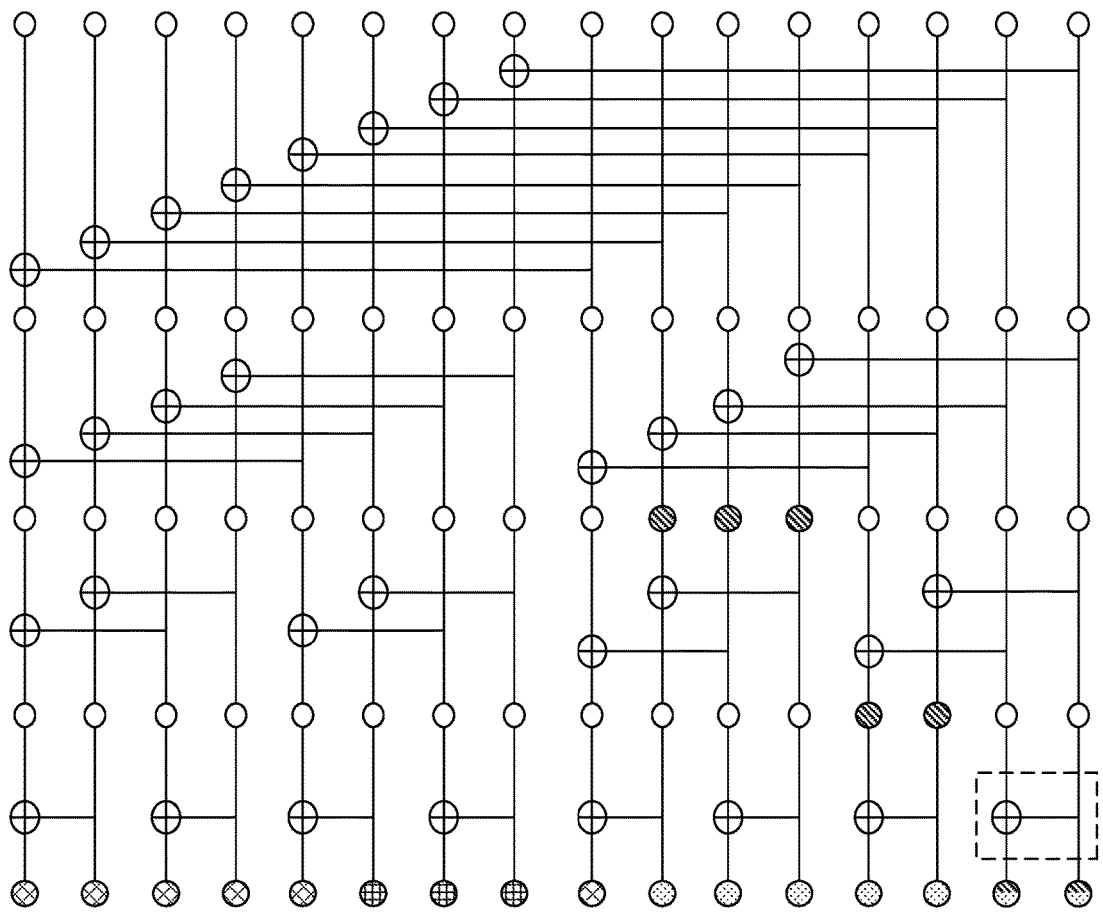
FIG. 9 is a diagram illustrating an example of encoding node selection for CRC using a minimum number of relaxations, according to one or more embodiments.

In various embodiments, the encoding position (or index) and layer of node bits may be selected to minimize the number of relaxed polarization (XOR) branches in the polar encoder, based on the relaxation rule in Operation-v, and/or in the encoding example as shown in FIG. 9. This option corresponds to one (1) relaxation operation independent of N, K, C. This operation/procedure may increase coding gain. In an example, the minimum number of relaxed branches can be achieved by selecting $v_{i,j}$ nodes based on the following (i,j) pair selection method:

If $j=0$, then $i\in[N-1,N]$;

If $j=1, \ldots, n-2$, then $i\in[N-2^{j+1}+1, N-2^j]$.

As an example, as shown in FIG. 9, the selected nodes for CRC are $v_{15,0}$, $v_{16,0}$, $v_{14,1}$, $v_{13,1}$, $v_{12,2}$, $v_{11,2}$, $v_{10,2}$.

In various embodiments, the encoding position (or index) and layer of node bits can be selected arbitrarily.

In Operation-v, XOR branches to the right of the nodes used for CRC may be omitted in the encoder, based on the relaxation rule that will remove short cycles of type-1 in the BP decoder.

ii. Periodic Grouping

In various embodiments, the node bits for CRC may be periodically grouped to create multiple CRC bits. Grouping may be performed (or done) arbitrarily or in a structured manner. An example of structured periodic grouping is described below. In an example, P denotes the period, and groups can be composed of the set of node bits:

$S_p=\{d_p, d_{p+P}, d_{p+2P}, \ldots, d_{p+(Q-1)P}\}$ where $Q=\lfloor(K-C)/P\rfloor$, $p=0, 1, 2, \ldots, P-1$ and $\lfloor x \rfloor$ denotes the largest integer less than a real number x. For P=1, the CRC encoding may be the same as the conventional single CRC encoding.

iii. CRC Encoding

In various embodiments, for each group, the payload bits may be encoded by independent CRC encoders and then CRC bits can be generated accordingly. Assuming $C_p$ is the CRC length for group $S_p$, then $C=\Sigma_{p=0}^{P-1}C_p$. Assuming $CRC_p$ denotes p-th set of CRC bits, $CRC_p$ is generated by CRC encoding of $S_p$. The total CRC bits may correspond to the union set of all the CRC bits for groups.

iv. Input to Polar Encoding

In various embodiments, a portion of or all information bits and/or CRC bits may be input to the polar encoder. The positions of CRC bits are at the head of K unfrozen bits derived by polar code construction process. Except CRC positions, there may be K–C unfrozen bits, and the K–C information bits can be input to those unfrozen bits in natural order in terms of a bit index number.

v. Relaxation (e.g., Omitting XOR Operations in Polar Encoding)

In various embodiments, if an encoding node $v_{i,j}$ is used for CRC bit creation (i.e., $v_{i,j}\in C_d$) and it is used for polarization with another node $v_{k,j}$ where k<i, the corresponding polarization branch for XOR operation may be relaxed (e.g., omitted). Therefore, the polarization (XOR) branch, if any, which is one level higher than that of $v_{i,j}$ is omitted. Illustration of the relaxation rule is given in FIG. 10. This rule, which is applied to the encoder, may remove short cycles caused by CRC bits in the factor graph of BP decoder.

In one embodiment, an example of the overall Polar encoding procedure may be described as following:

K32 10, C=3 are assumed and M=7 node bits for CRC are also assumed.

$d_0, d_1, d_2, d_3, d_4, d_5, d_6$ denote node bits for CRC,

Periodic grouping (structured grouping example given here for CRC at layer-0)

P=3 is assumed and corresponds to three independent CRC encoding with a length of 1.

$Q=\lfloor(10-3)/3\rfloor=2$

Grouping

The first group: $d_0, d_3, d_6$

The second group: $d_1, d_4$

The third group: $d_2, d_5$

CRC encoding for each group

CRC encoding for the first group: $d_0+d_3+d_6$

CRC encoding for the second group: $d_1+d_4$

CRC encoding for the third group: $d_2+d_5$

N=16, K=10, C=3, unfrozen set A={$u_6, u_7, u_8, u_{10}, u_{11}, u_{12}, u_{13}, u_{14}, u_{15}, u_{16}$}

Head CRC positions are assumed and $u_6, u_7, u_8$ are CRC bit positions.

Same CRC length is assumed, $C_0=C_1=C_2=1$ and $CRC_0=\{u_6\}$, $CRC_1=\{u_7\}$, $CRC_2=\{u_8\}$ $d_0=u_{10}, \ldots, d_6=u_{16}$ $u_6=d_0+d_3+d_6=u_6+u_{10}+u_{13}$ $u_7=d_1+d_4=u_7+u_{11}$ $u_8=d_2+d_5=u_8+u_{12}$ Note that the range of index u (from 1 to N) and d (from 0 to M−1) are different.

Figure 11:
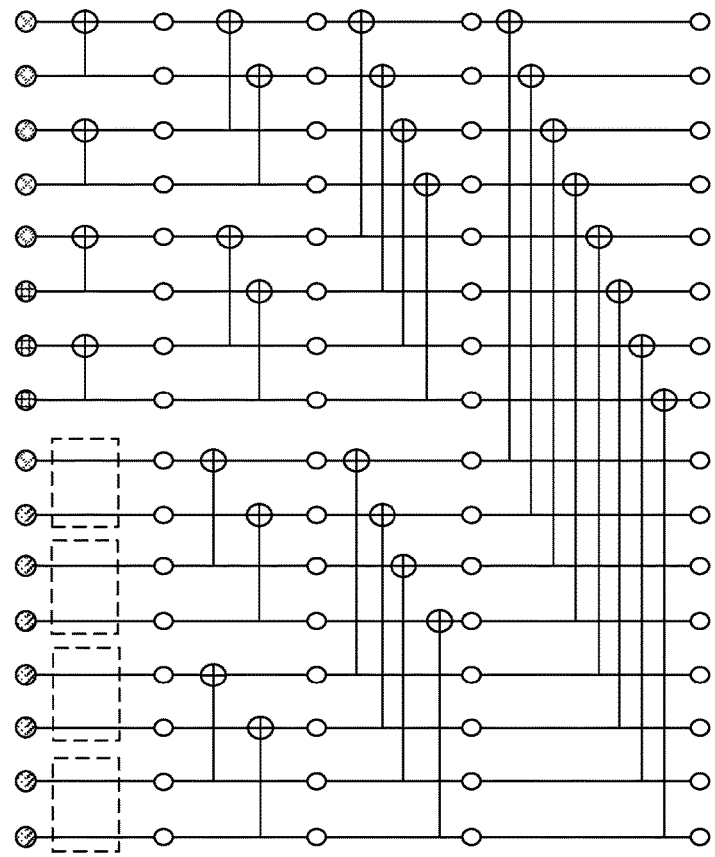
FIG. 11 is a diagram illustrating an example of relaxation operations for polar encoder with encoding nodes for CRC (e.g., selected from layer-0), according to one or more embodiments.

Relaxation operation in polar encoding is done based on the proposed relaxation rule. In this example, because the nodes for CRC ($d_0, \ldots, d_6$) are all selected from layer-0, the corresponding relaxed polar encoding is given in FIG. 11.

Figure 12:
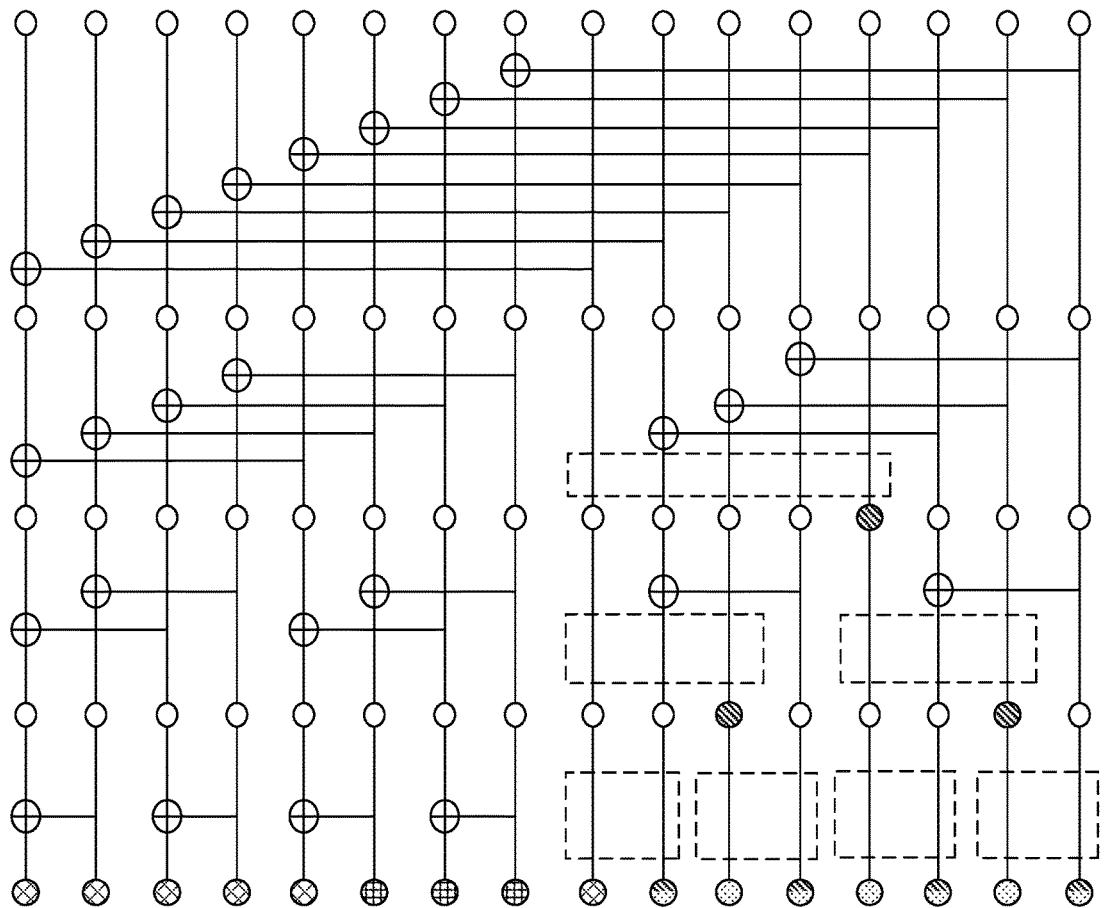
FIG. 12 is a diagram illustrating an example of a polar encoder using a maximum number of relaxation operations, according to one or more embodiments.

If maximum number of relaxations is desired, then in the example above, nodes for CRC can be selected so that $d_0=v_{10,0}$, $d_1=v_{12,0}$, $d_2=v_{14,0}$, $d_3=v_{16,0}$, $d_4=v_{11,1}$, $d_5=v_{15,1}$, $d_6=v_{13,2}$. In this case, the relaxed encoding (with K–C=7 relaxation operations) is given in FIG. 12. This option may decrease latency.

Figure 13:
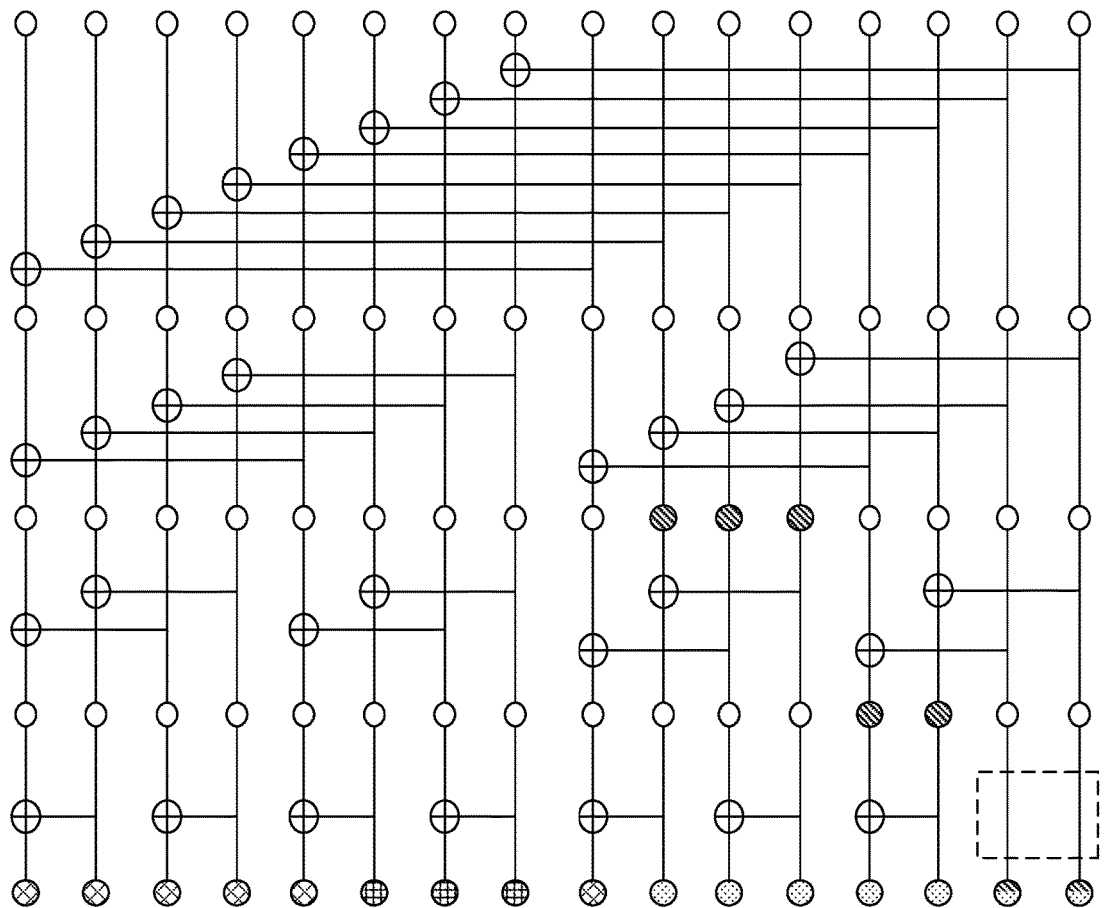
FIG. 13 is a diagram illustrating an example of a polar encoder using a minimum number of relaxation operations, according to one or more embodiments.

If minimum number of relaxations is desired, then in the example above, nodes for CRC can be selected so that $d_0=v_{15,0}$, $d_1=v_{16,0}$, $d_2=v_{14,1}$, $d_3=v_{13,1}$, $d_4=v_{12,2}$, $d_5=v_{11,2}$, $d_6=v_{10,2}$. In this case, the relaxed encoding with one (1) relaxation operation is given in FIG. 13. This option may increase coding gain.

Representative Procedure for Periodic CRC-Aided BP Decoding

Figure 14:
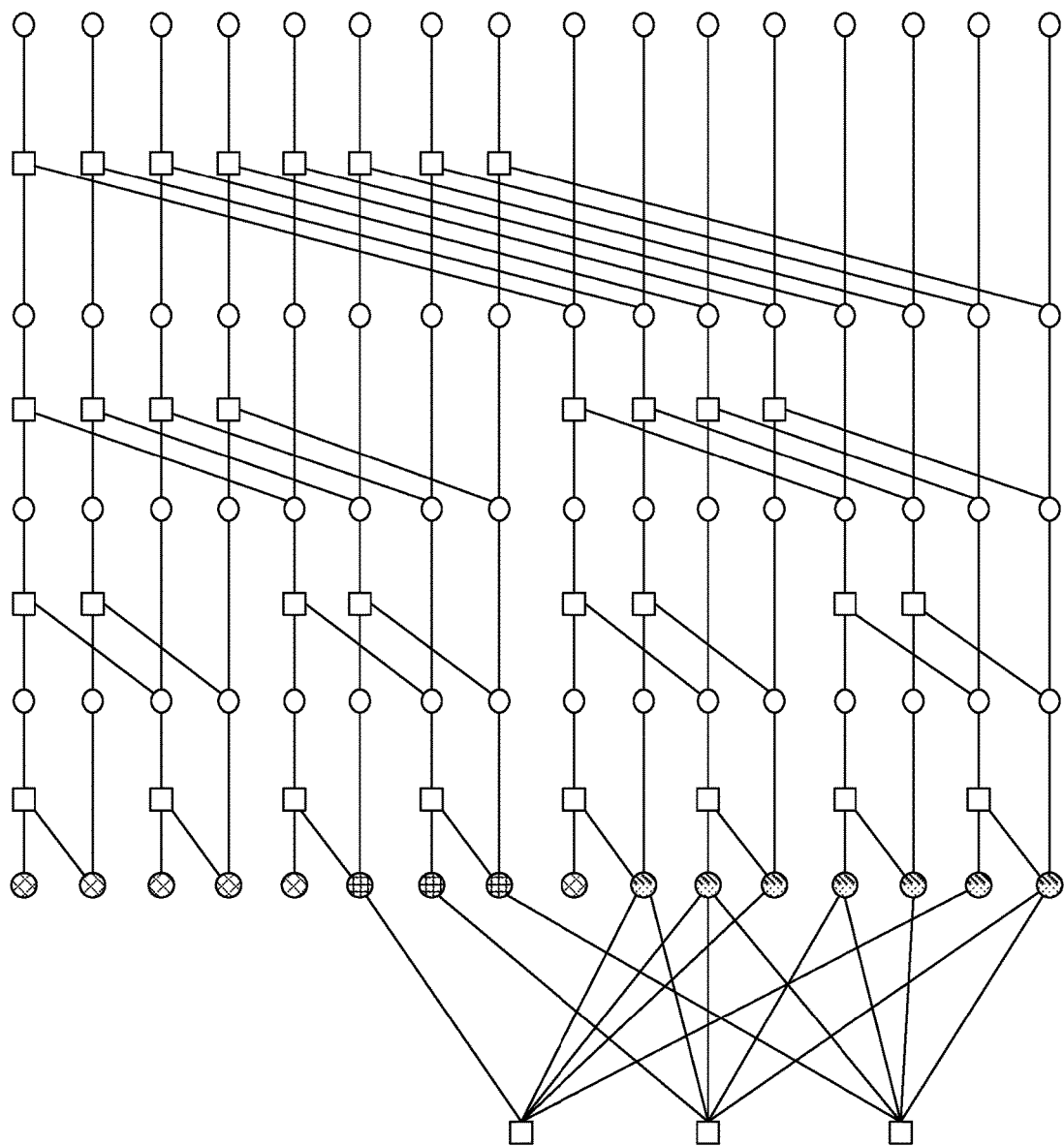
FIG. 14 is a diagram illustrating an example of a BP decoder factor graph with CRC (e.g., CRC generated from encoding nodes at layer-0), according to one or more embodiments.
Figure 15:
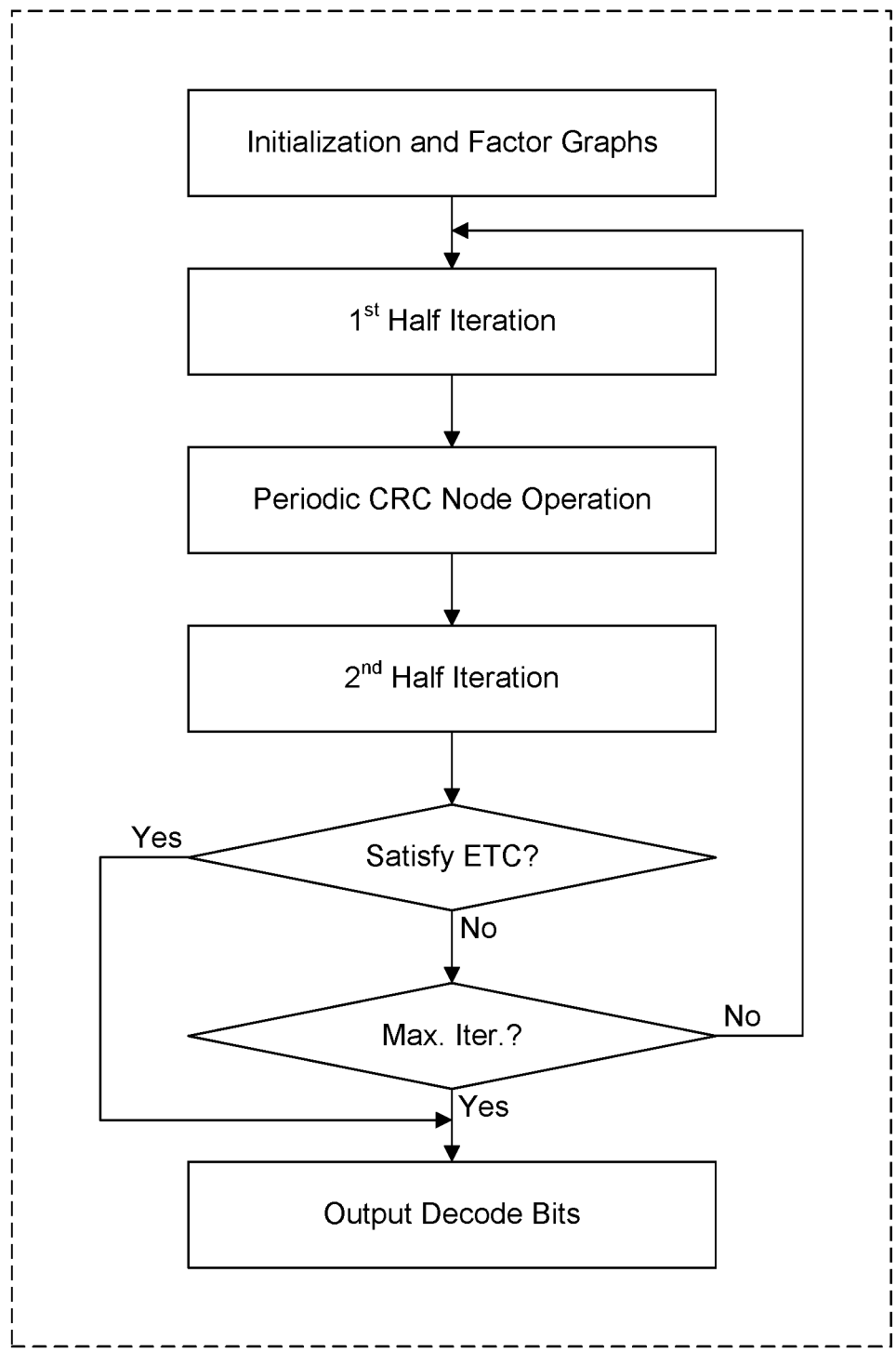
FIG. 15 is a flowchart illustrates an example of a periodic CRC-aided BP decoder, according to one or more embodiments.

In various embodiments, for each iteration of BP decoder, one factor graph corresponding to one of CRC bits is used, including CRC dependent relaxation operations applied at the encoder, while short cycles in factor graph are removed. In an example, a reinitialization operation for the LLR values of the left-to-right iteration using CRC bits is applied between two half iterations of BP decoding. FIG. 14 is for notation, and FIG. 15 provides an example of a procedure (in a flowchart) using periodic CRC-aided BP decoding.

A. Initialization and Factor Graphs

In an initialization step, Log-Likelihood Ratio (LLR) value(s) for the received channel symbols may be calculated, and the variable nodes corresponding to the channel symbol(s) (rightmost variable nodes in BP decoding) are initialized. An example factor graph for BP polar decoder (including CRC bits) is shown in FIG. 14. N=16, K=10, and C=3 are assumed for all examples in this section if there is no additional condition or limitation.

In various embodiments, BP decoding with CRC bits may not show bit error rate (BER)/frame error rate (FER) performance improvement. This is due to short cycles in factor graph when CRC bits are included. The short cycles in BP decoding should be prevented to achieve better error performance.

Figure 16:
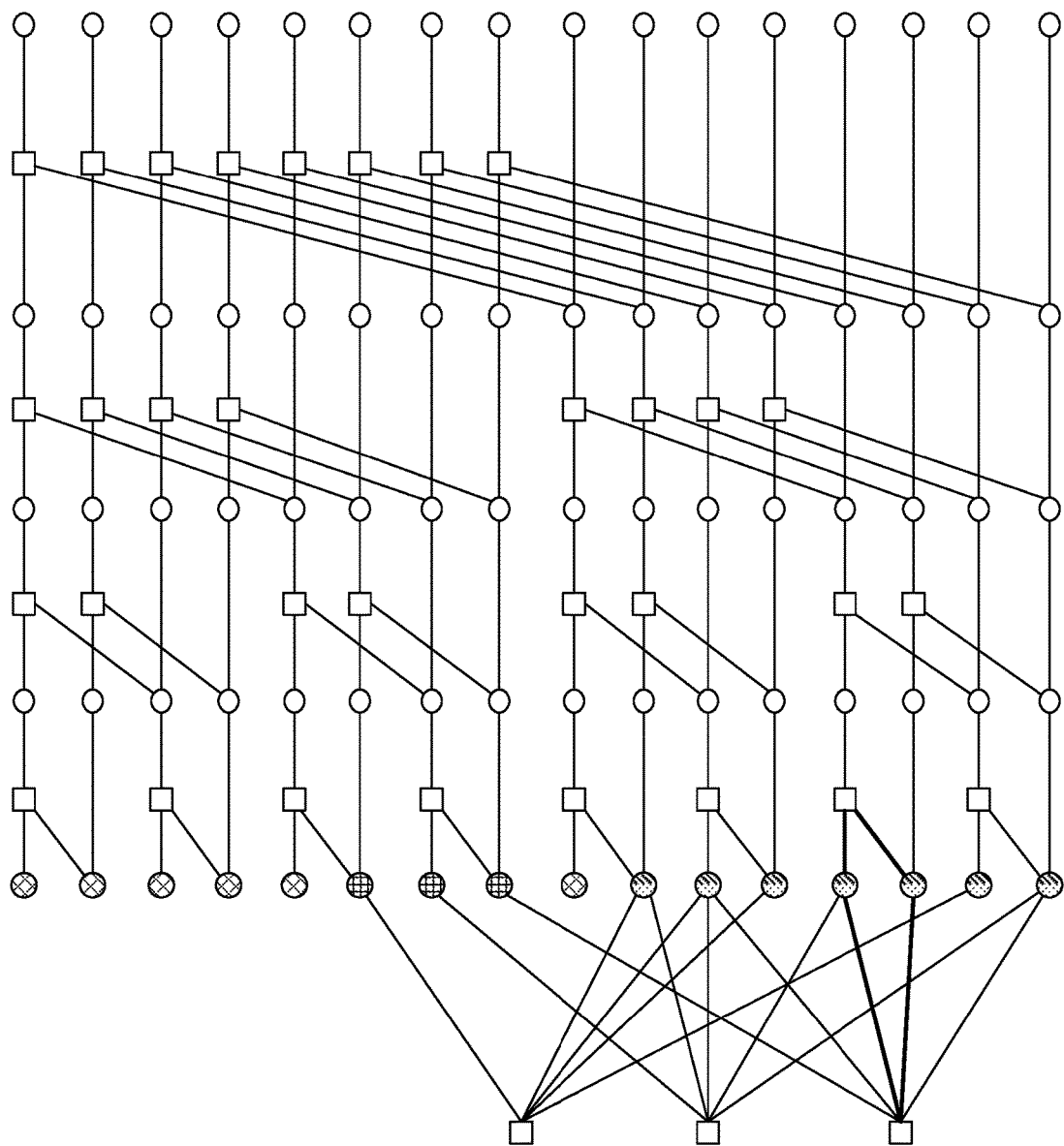
FIG. 16 is a diagram illustrating a first example of a short cycle of type-1 in BP decoder factor graph with CRC (e.g., CRC generated from layer-0), according to one or more embodiments.
Figure 17:
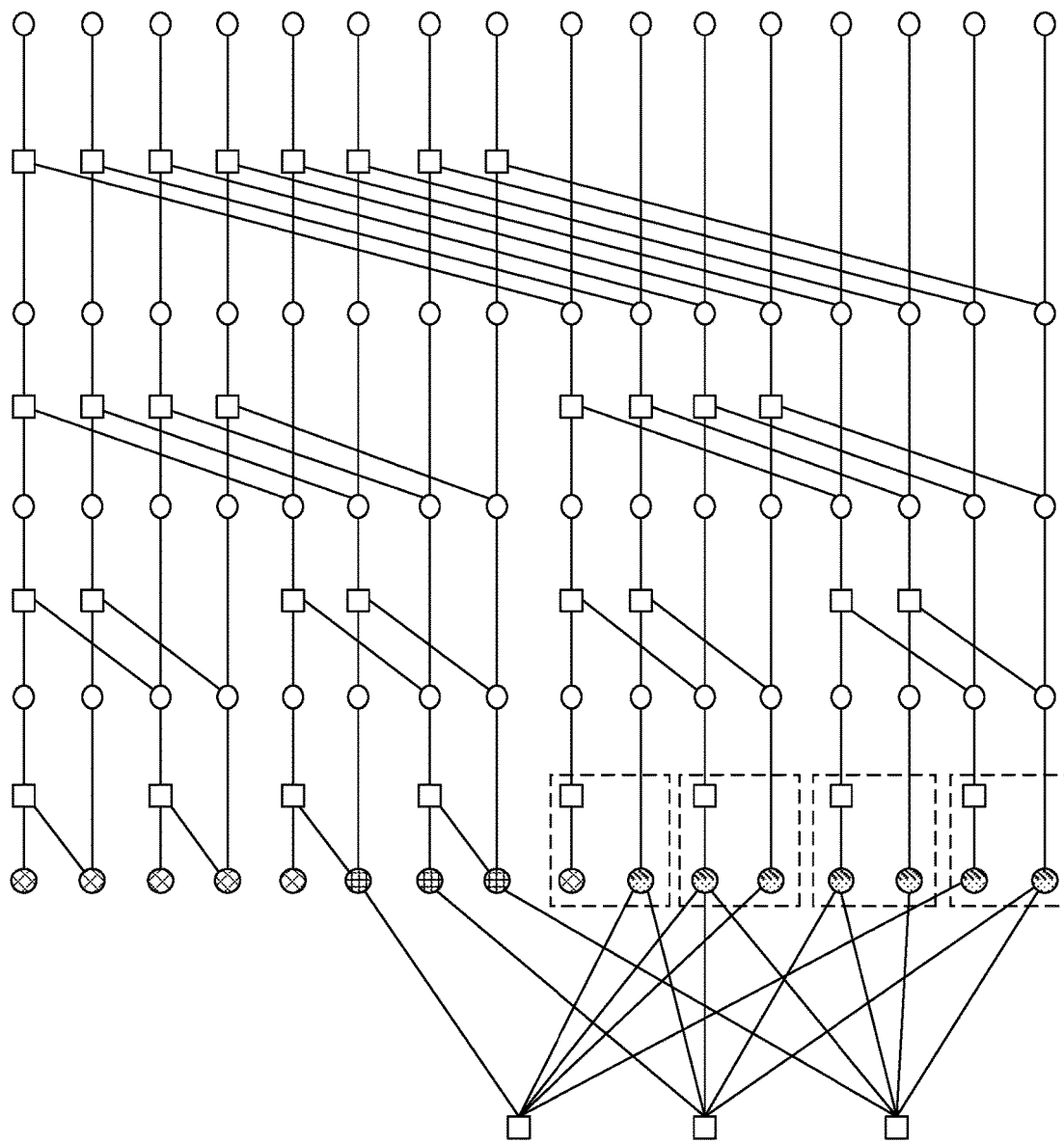
FIG. 17 is a diagram illustrating a first example of removing short cycles of type-1 by relaxation in BP decoder factor graph with CRC (e.g., CRC generated from layer-0), according to one or more embodiments.

There are two types of short cycles induced by factor graphs based on CRC bits. A first type of short cycle is illustrated in FIG. 16 with the black bold lines. There can be more than one short cycle of this type or none. The girth (the length of short cycle) is four (4) because four edges are found in it. This short cycle can be removed by introducing relaxation. The relaxed polar codes can provide comparable performance to original polar code. FIG. 17 shows an example of modified relaxed polar code where all short cycles of this type in the factor graph are removed using the relaxation rule given above. The red dotted boxes depict relaxed (omitted) XOR operations in polar encoding process.

Figure 18:
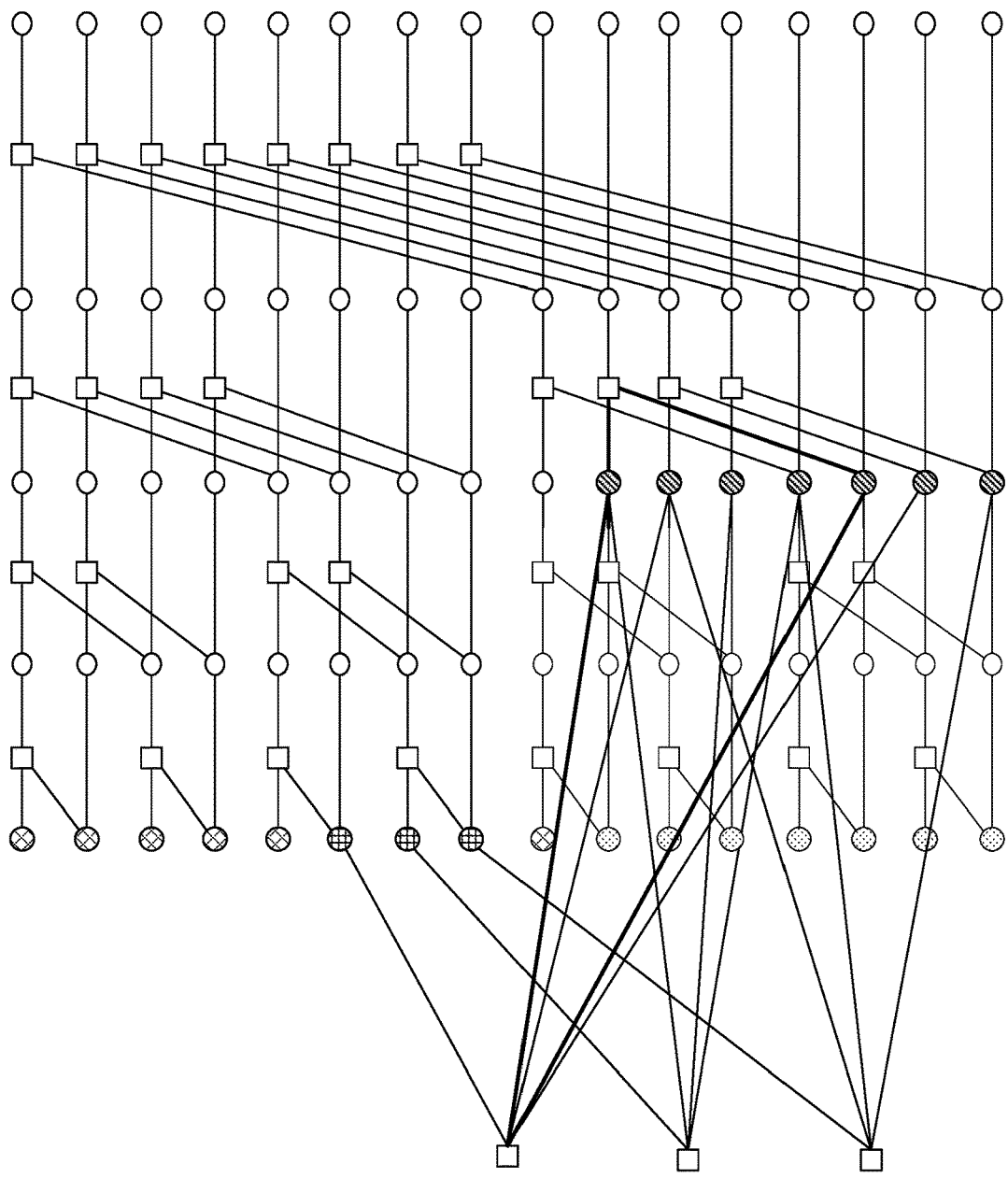
FIG. 18 is a diagram illustrating a second example of a short cycle of type-1 in BP decoder factor graph with CRC (e.g., CRC generated from encoding nodes in layer-2), according to one or more embodiments.
Figure 19:
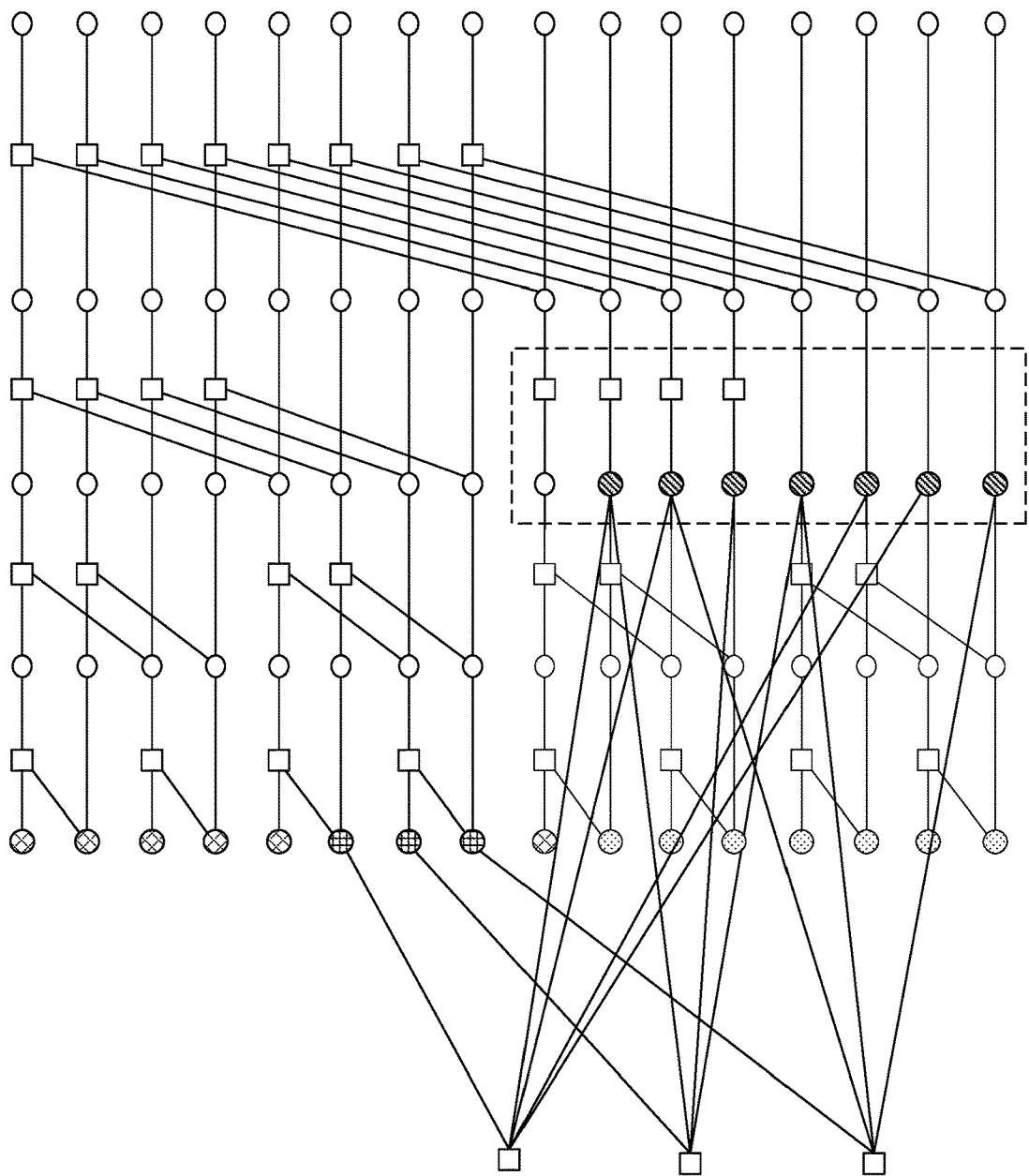
FIG. 19 is a diagram illustrating a second example of removing short cycles of type-1 by relaxation in BP decoder factor graph with CRC (e.g., CRC generated from encoding nodes in layer-2), according to one or more embodiments.
Figure 20:
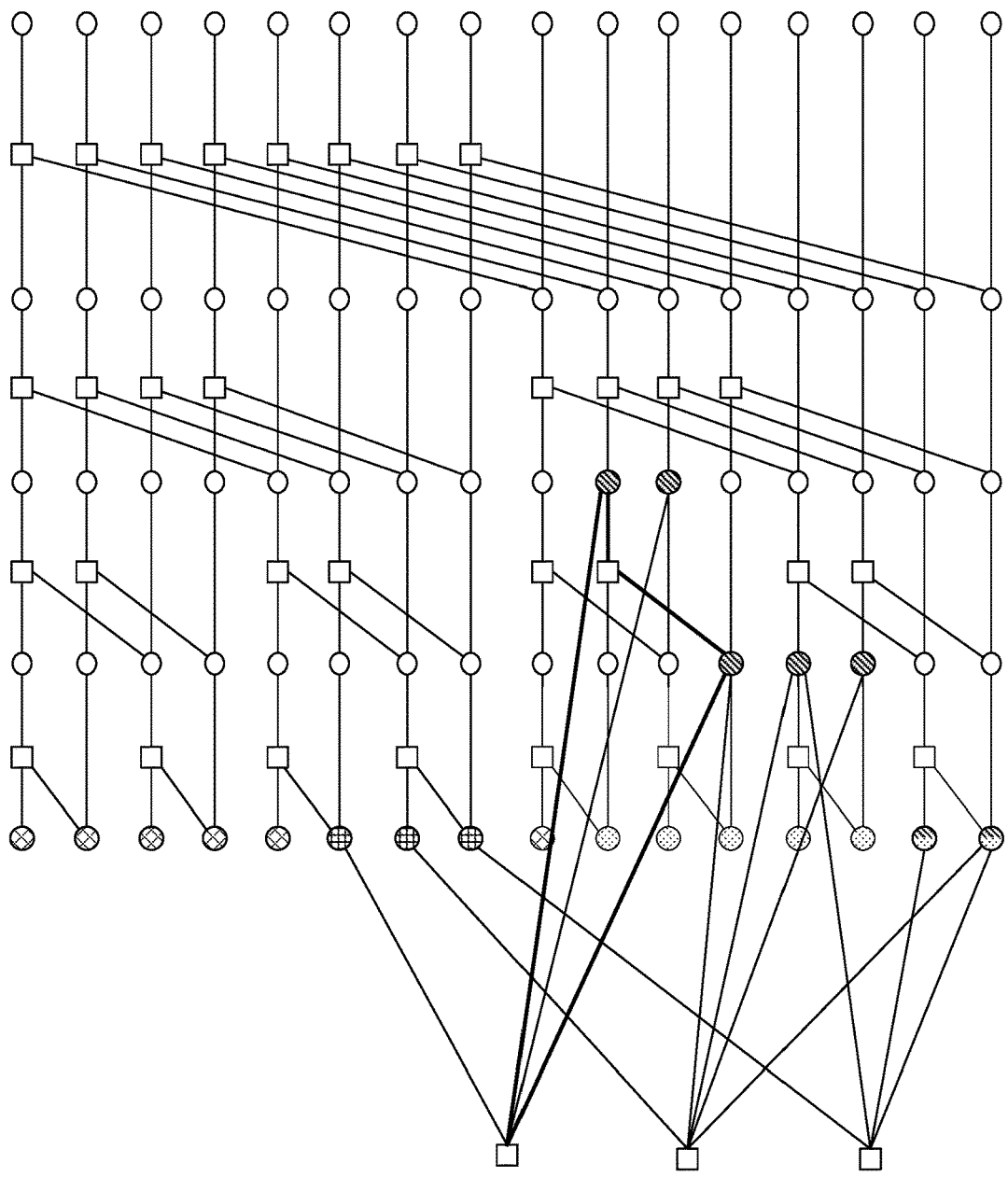
FIG. 20 is a diagram illustrating a third example of a short cycle of type-1 in BP decoder factor graph with CRC (e.g., CRC generated from encoding nodes in different layers), according to one or more embodiments.
Figure 21:
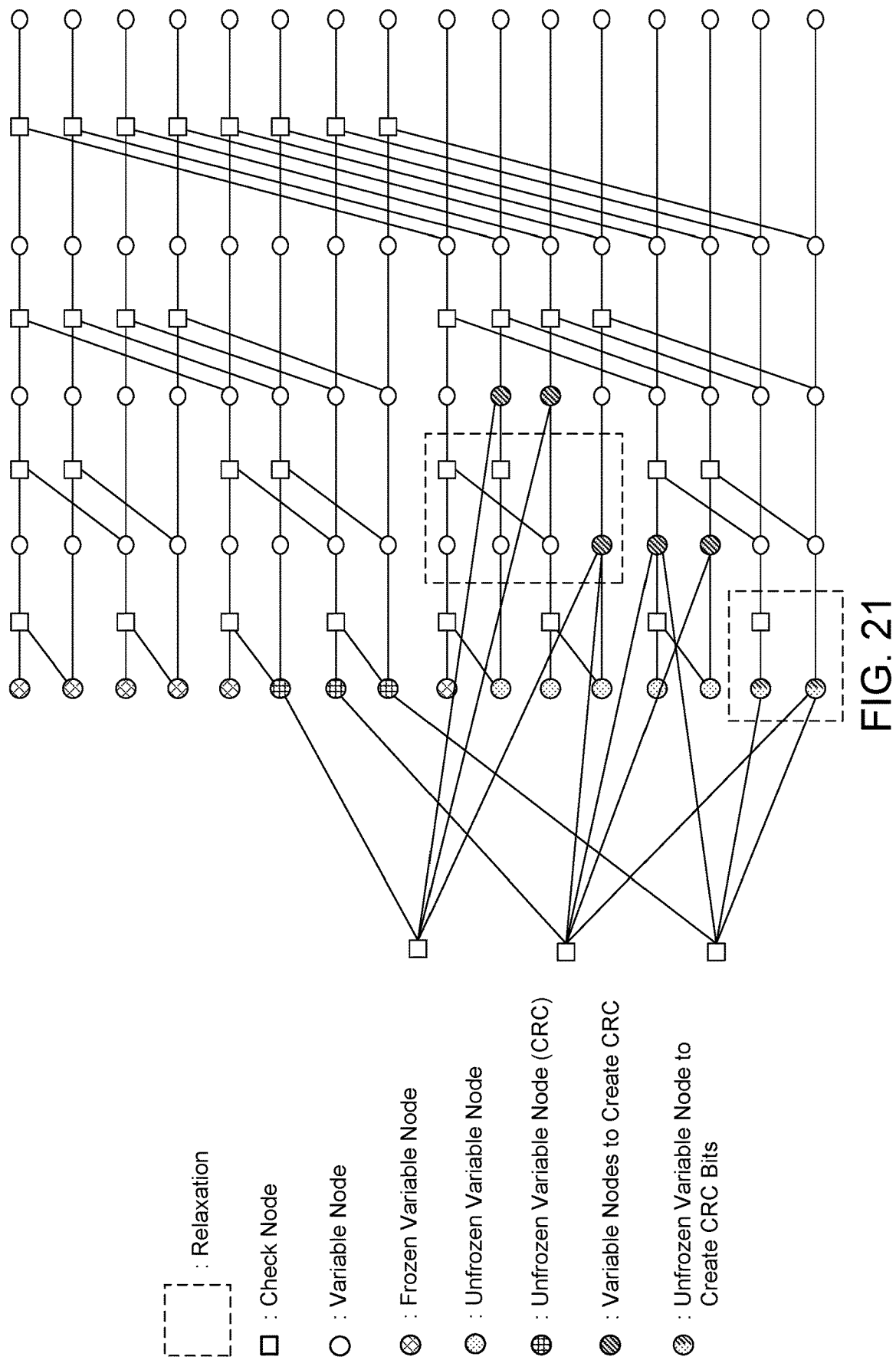
FIG. 21 is a diagram illustrating a third example of removing short cycles of type-1 by relaxation in BP decoder factor graph with CRC (e.g., CRC generated from encoding nodes in different layers), according to one or more embodiments.

The First type of short cycle can be observed when CRC node bits from different layers are used. An example of this type of cycle when node bits for CRC are at layer-2 and related relaxation are given in FIG. 18 and FIG. 19, respectively. In another example of this type of cycle, node bits for CRC may at different layers and related relaxation, which are illustrated in FIG. 20 and FIG. 21, respectively.

The relaxation method for the encoding process (described in the CRC dependent relaxation for polar encoder) may be used to remove short cycles of type-1 from the factor graph of BP decoder. Selecting the encoding nodes for CRC from different layers may increase the girth.

Figure 22:
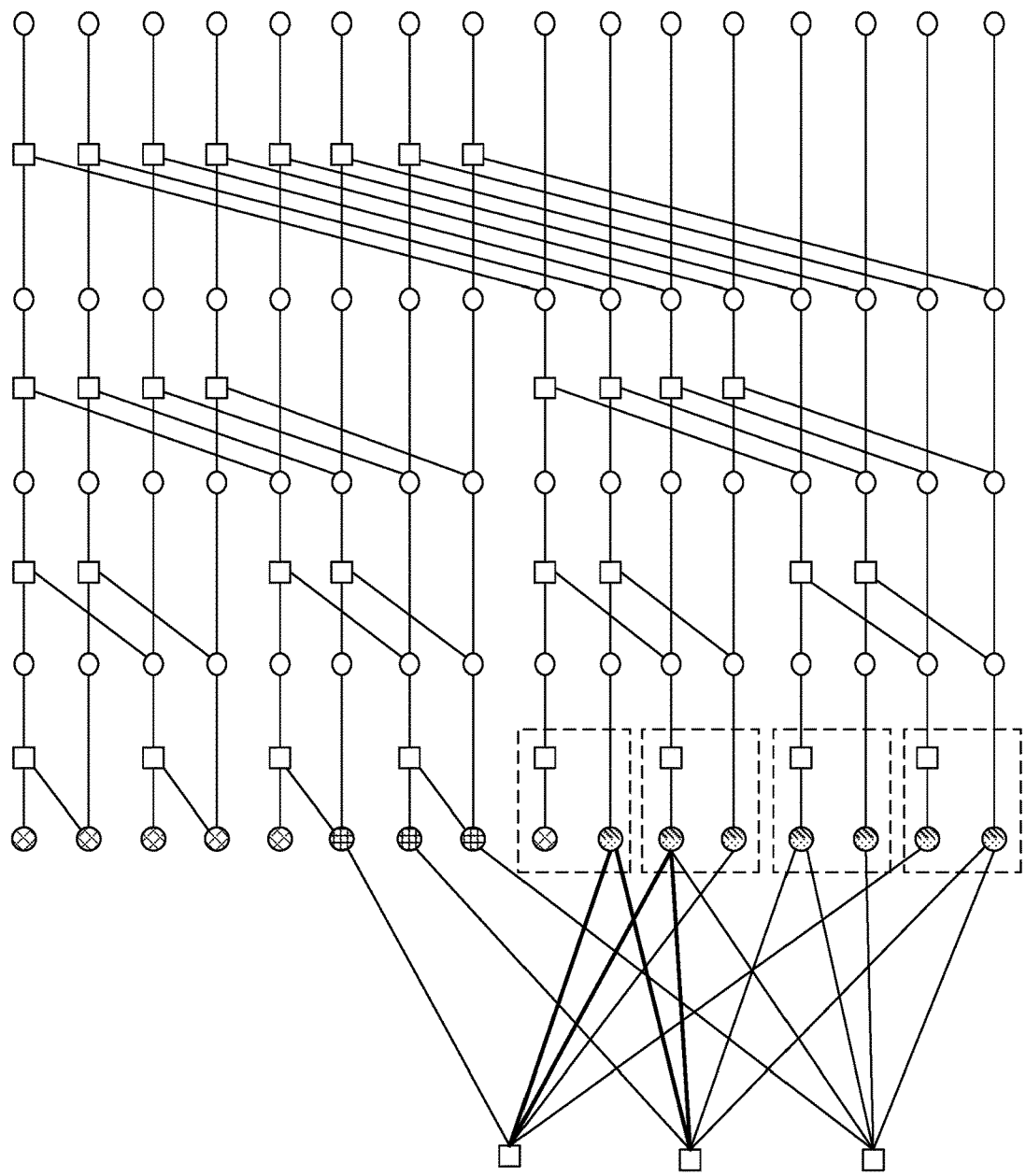
FIG. 22 is a diagram illustrating an example of a short cycle of type-2 between two different CRC bits, according to one or more embodiments.
Figure 23:
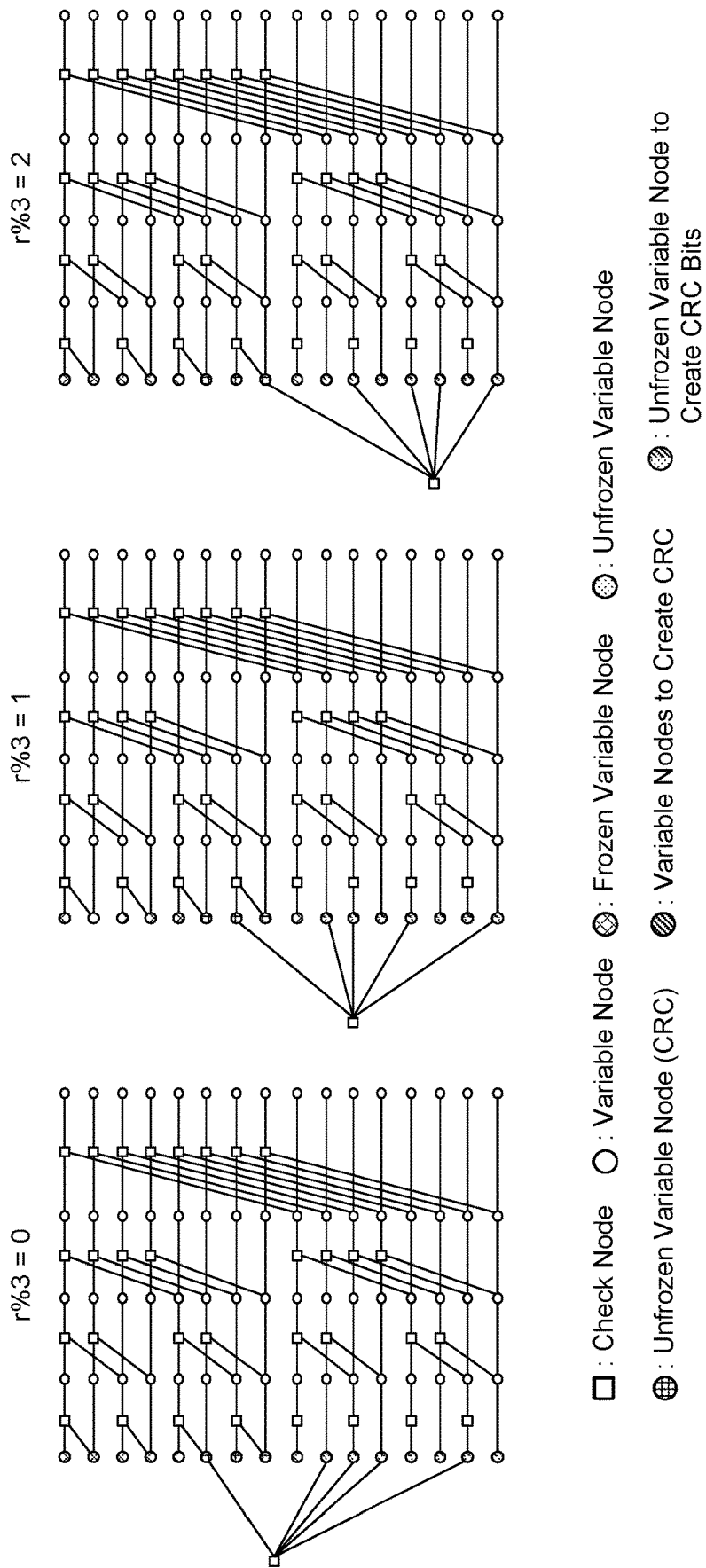
FIG. 23 is a diagram illustrating an example of periodic factor graphs to remove short cycles of type-2 in BP decoding operation(s), according to one or more embodiments.

The second type of short cycle is shown in FIG. 22 with black bold lines. This type of short cycle can be removed by introducing periodic CRC operation at the decoder. At each iteration, only one factor graph corresponding to a CRC bit can be processed in BP decoding. In the example (as shown in FIG. 22), there are three CRC bits and the factor graph corresponding to r %3-th CRC bit is used where r denotes the iteration number and % denotes the modulo operator. The factor graphs to be used for periodic CRC operation at the decoder are illustrated in FIG. 23. For iteration r, half left/half right calculation in FIG. 24 can be processed using the factor graph of r %3-th CRC bit as given in FIG. 23. FIG. 22 and FIG. 23 depict the short cycle and factor graphs for periodic operation for CRC bits created from layer-0. Same or similar procedures may be applied for CRC bits generated from other layers of the polar encoder.

B. $1^{st}/2^{nd}$ Half Iterations

Figure 24:
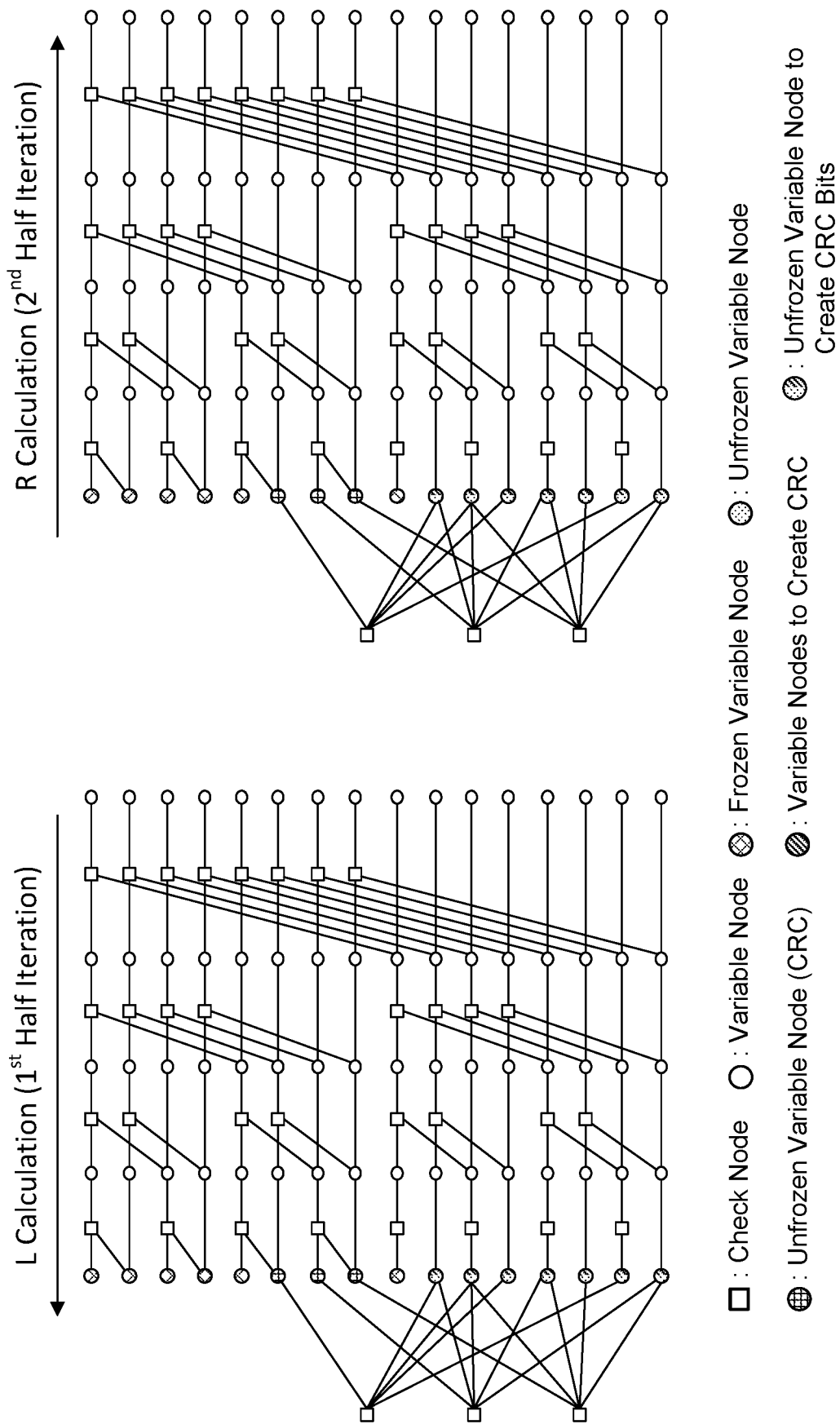
FIG. 24 is a diagram illustrating an example of one iteration of BP decoding operation(s), according to one or more embodiments.

One iteration of BP decoding consists of two half iterations as shown in FIG. 24. In the first half iteration, left value L based on Equation 3 and/or Equation 4 are calculated from the rightmost to the leftmost. In the second half iteration, right value R based on Equation 5 and/or Equation 6 are calculated from the leftmost to the rightmost.

C. Periodic CRC Operation

Periodic CRC operation is applied between the two half iterations. This operation is done after the leftmost variable nodes in BP decoding is updated. In each iteration, only one factor graph corresponding to one of CRC bits can be processed in periodic manner. Between the $1^{st}$ and $2^{nd}$ iterations a reinitialization process for $R_{i,0}$ is applied as:

$$R_{i,0} = \alpha \cdot \prod_{k \neq i, (k,j) \in B_{m \leftarrow r \% C}} \text{sgn}(L_{k,j}) \cdot \min_{k \neq i, (k,j) \in B_{m \leftarrow r \% C}} |L_{k,j}|,$$

for all $i \in CRC_I$ where $L_{k,j}$ denotes the right-to-left LLR values of node $v_{k,j}$, i denotes the encoding bit position (index), $CRC_i$ denotes the set of indices of CRC bits (nodes), $B_m$ for m=0, 1, . . . , C–1 denotes the set of encoding node (index,layer) pair connected with a check node corresponding to c-th CRC bit, m=r %C, r is the iteration number, C denotes the number of CRC bits, % denotes the modulus operator. As an example, in FIG. 23, $B_0$={(6,0), (10,0), (11,0), (12,0), (15,0)}, $B_1$={(7,0), (10,0), (11,0), (13,0), (16,0)} and $B_2$={(8,0), (11,0), (13,0), (14,0), (16,0)}, and $CRC_I$={6,7,8} for C=3. The reinitialization is based on the min-sum formula.

D. Finalization of Single BP Decoder Iterations

After two half iterations, early termination condition (ETC) is checked, and the iterations are finished when it is satisfied. When it is not satisfied, it is checked whether the predetermined maximum iteration number is reached. If the current iteration number is equal to the maximum iteration number, the decoding ends and final decoded bits are derived based on the hard decision of left most LLR value.

In various embodiments, the CRC-aided BP decoding mechanism/procedure may include one or more of the following operations:

---

Figure 25:
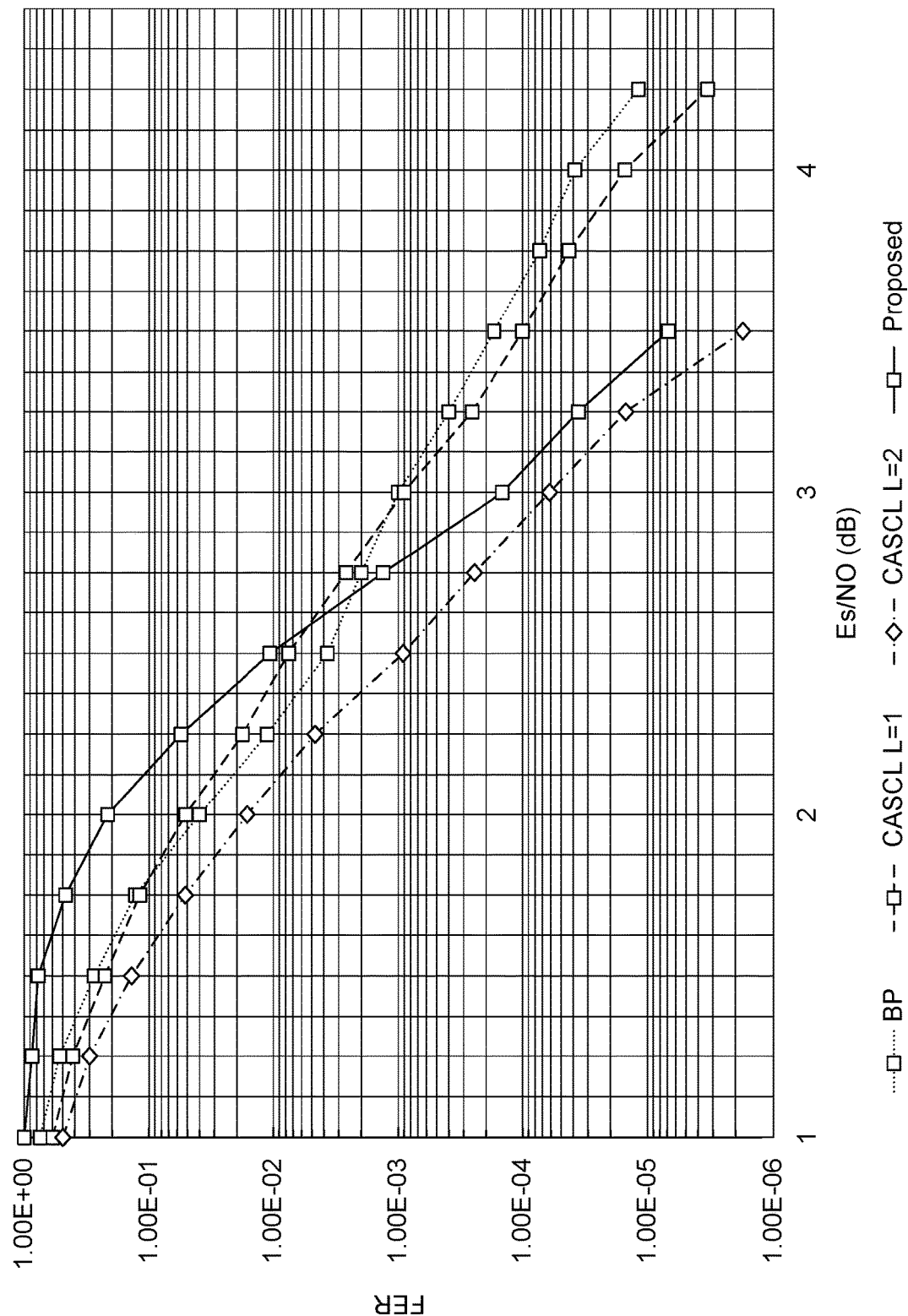
FIG. 25 is a diagram illustrating an example of FER performance comparisons using various polar coding schemes, according to one or more embodiments.
Figure 26:
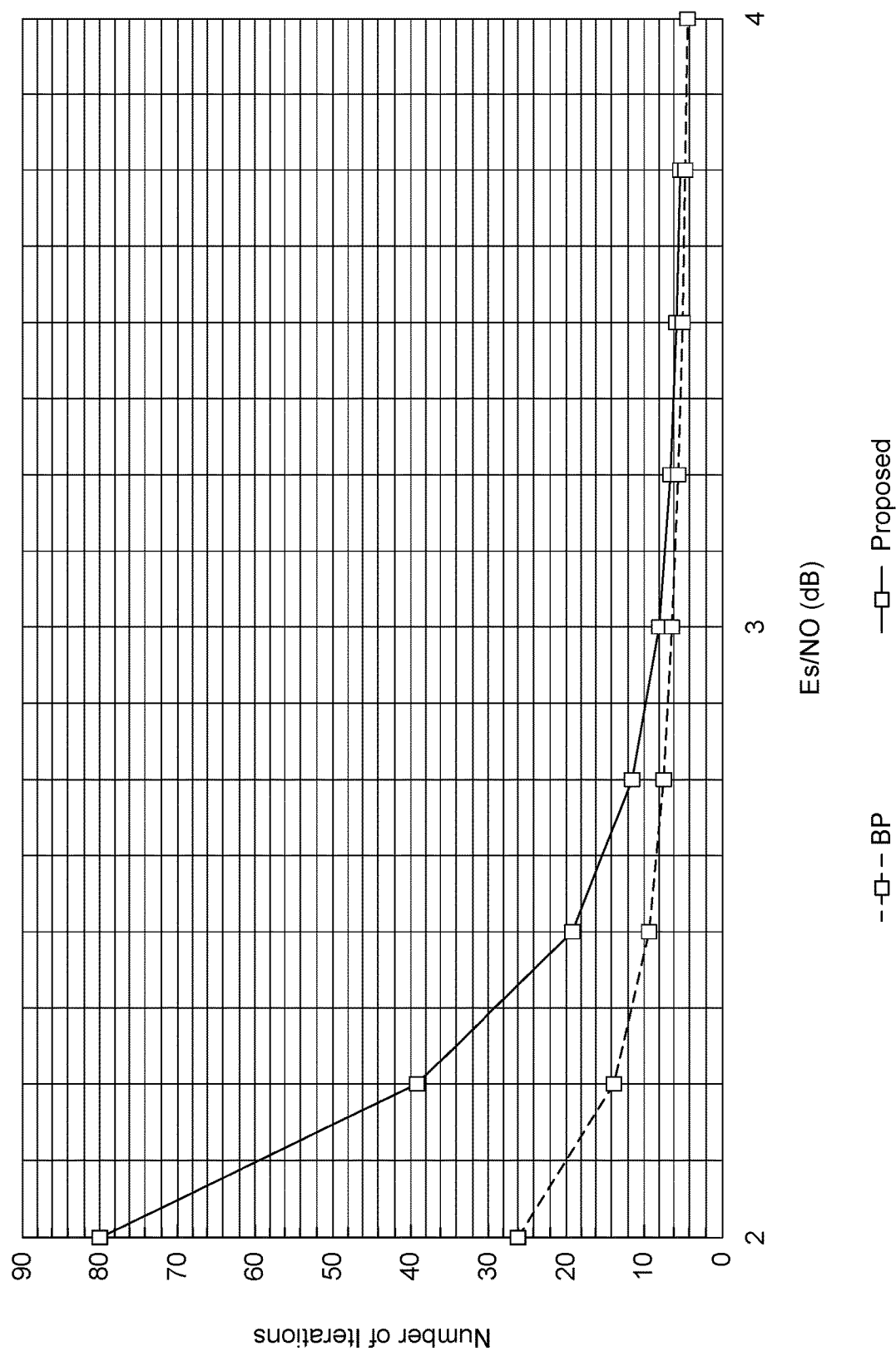
FIG. 26 is a diagram illustrating an example of average number iterations for a conventional BP decoding method/procedure compared with a proposed BP decoding method/procedure, according to one or more embodiments.

1: Create periodic factor graphs for relaxed polar code
2: Set maximum iteration number for BP decoder (max_iter)
3: Set CRC scheduling -continued 4: Initialize $L_{i,n}$ (channel LLR) (n = log N)

$$L_{i,n} = \ln \frac{P(y_i \mid x_i = 0)}{P(y_i \mid x_i = 1)}$$

where $x_i$ denotes the output of polar encoder (i.e., transmitted signal) and $y_i$ denotes the received signal. All other $L_{i,j}$ are set to 0.
5: Initialize $R_{i,o}$ (frozen/unfrozen LLR)
    For unfrozen inputs $R_{i,o} = \infty$. All other $R_{i,j}$ are set to 0.
6: for r = 0 to max_iter
7:    while ETC not satisfied or CRC failure do
8:       Left-to-right half iteration
9:       Reinitialization of $R_{i,o}$
10:      ETC / CRC check
11:      Right-to-left half iteration
12:    endwhile
13: endfor In simulation examples, component codes may be relaxed as a sub-case of the proposed relaxation method. Simulation conditions are summarized in Table I and Table II. In FIG. 25, FER results of BP, CA-SCL and the proposed encoding and decoding schemes presented in a CRC dependent relaxation for polar encoder and a Periodic CRC-aided BP Decoder are shown. In FIG. 25, the proposed scheme shows comparable FER performance to L=2 CA-SCL decoding scheme with a SNR difference of ~0.15 dB at FER of $10^{-5}$. In an example, a proposed scheme may have similar average iterations as the conventional BP decoding at a high SNR range (as shown in FIG. 26).

TABLE I

Simulation conditions

| Conditions | Parameters |
|---|---|
| N | 1024 |
| K(including CRC) | 512 |
| Code rate | (512-16)/1024 |
| CRC | 16 bits CRC |
| Code construction | 3GPP NR polar code construction |
| Modulation | QPSK |
| Minimum counted error | 100 block errors |

TABLE II

Decoding schemes

| Schemes | Parameters |
|---|---|
| CASCL | List size (L) = 1,2 |
| BP decoding | Scaled min-sum roundtrip scheduling (scaling factor = $1 - \frac{1}{128}$), max iter#=200 |
| Proposed | Scaled min-sum roundtrip scheduling (scaling factor = 1), max iter# = 200 |

Representative Procedures for Polar Encoding and/or Decoding

Various embodiments disclosed herein are related to methods, apparatuses, and procedures for polar encoding and decoding, including CRC aided encoding and BP decoding for polar codes in wireless communications (e.g., in a 5G NR network).

In one embodiment, a method implemented by a WTRU (e.g., WTRU 102) for wireless communications includes determining a first set of encoding nodes used for creating a set of CRC bits; determining a first set of polarization branches, and each of the first set of polarization branches is associated with a respective encoding node of the first set of encoding nodes used for creating the set of CRC bits; and determining a second set of polarization branches, and each of the second set of polarization branches is at least one level higher than a respective polarization branch of the first set of polarization branches. The method also includes performing one or more polar encoding operations for the second set of polarization branches; generating a second set of encoding nodes based on the performed one or more polar encoding operations for the second set of polarization branches; and transmitting polar code bits using the generated second set of encoding nodes.

In one embodiment, the one or more polar encoding operations discussed herein may comprise 1) selecting one or more relaxation rules, and/or 2) omitting or delaying one or more XOR operations for the second set of polarization branches. In another embodiment, the one or more polar encoding operations discussed herein may comprise removing, in a BP decoding factor graph, one or more short cycles that originated from the set of CRC bits.

In one embodiment, the method may include determining a maximum number of relaxed polarization branches in a polar encoder of the WTRU, and selecting a position, an index, and/or a layer of a set of encoding node bits based on the determined maximum number of relaxed polarization branches.

In another embodiment, the method may include determining a minimum number of relaxed polarization branches in a polar encoder of the WTRU, and selecting a position, an index, and/or a layer of a set of encoding node bits based on the determined minimum number of relaxed polarization branches.

In one embodiment, the method may include selecting, from an input layer or an intermediate layer of a polar encoder of the WTRU, one or more bits associated with the first set or the second set of encoding nodes.

In another embodiment, the method may include performing a reinitialization operation for a set of log-likelihood ratio (LLR) values of a left-to-right iteration using the set of CRC bits being applied between two half iterations of the BP decoder.

In one embodiment, a method implemented by a WTRU (e.g., WTRU 102) for wireless communications includes determining, for each iteration of a BP decoder in the WTRU, a factor graph corresponding to one of a set of CRC bits being used; determining one or more CRC-dependent relaxation operations used in a polar encoder; and determining whether one or more short cycles in a factor graph is removed based on the determined one or more CRC-dependent relaxation operations.

In another embodiment, a method implemented by a WTRU (e.g., WTRU 102) for wireless communications includes determining a set of input encoding node bits for CRC; performing periodic grouping for the set of input encoding node bits; performing CRC encoding for each group of bits based on the performed periodic grouping; inputting CRC encoded bits to polar encoding; omitting one or more XOR operations in polar encoding; and outputting polar code bits.

In one embodiment, the WTRU (e.g., WTRU 102) comprising a processor, a transmitter, a receiver, and/or memory is configured to implement one or more methods disclosed herein.

In an example, the WTRU (e.g., WTRU 102) is configured to determine a first set of encoding nodes used for creating a set of CRC bits; determine a first set of polarization branches, and each of the first set of polarization branches is associated with a respective encoding node of the first set of encoding nodes used for creating the set of CRC bits; determine a second set of polarization branches, and each of the second set of polarization branches is at least one level higher than a respective polarization branch of the first set of polarization branches. The WTRU is further configured to perform one or more polar encoding operations for the second set of polarization branches; generate a second set of encoding nodes based on the performed one or more polar encoding operations for the second set of polarization branches; and transmit polar code bits using the generated second set of encoding nodes.

In an example, when performing polar encoding operation(s) for the second set of polarization branches, the WTRU is further configured to select one or more relaxation rules, and to omit or delay one or more XOR operations for the second set of polarization branches. In another example, when performing polar encoding operation(s) for the second set of polarization branches, the WTRU is further configured to remove, in a BP decoding factor graph, one or more short cycles that originated from the set of CRC bits.

Conclusion

Although features and elements are described above in particular combinations, one of ordinary skill in the art will appreciate that each feature or element can be used alone or in any combination with the other features and elements. In addition, the methods described herein may be implemented in a computer program, software, or firmware incorporated in a computer readable medium for execution by a computer or processor. Examples of non-transitory computer-readable storage media include, but are not limited to, a read only memory (ROM), random access memory (RAM), a register, cache memory, semiconductor memory devices, magnetic media such as internal hard disks and removable disks, magneto-optical media, and optical media such as CD-ROM disks, and digital versatile disks (DVDs). A processor in association with software may be used to implement a radio frequency transceiver for use in a WTRU 102, UE, terminal, base station, RNC, or any host computer.

Moreover, in the embodiments described above, processing platforms, computing systems, controllers, and other devices containing processors are noted. These devices may contain at least one Central Processing Unit ("CPU") and memory. In accordance with the practices of persons skilled in the art of computer programming, reference to acts and symbolic representations of operations or instructions may be performed by the various CPUs and memories. Such acts and operations or instructions may be referred to as being "executed," "computer executed" or "CPU executed."

One of ordinary skill in the art will appreciate that the acts and symbolically represented operations or instructions include the manipulation of electrical signals by the CPU. An electrical system represents data bits that can cause a resulting transformation or reduction of the electrical signals and the maintenance of data bits at memory locations in a memory system to thereby reconfigure or otherwise alter the CPU's operation, as well as other processing of signals. The memory locations where data bits are maintained are physical locations that have particular electrical, magnetic, optical, or organic properties corresponding to or representative of the data bits. It should be understood that the representative embodiments are not limited to the above-mentioned platforms or CPUs and that other platforms and CPUs may support the provided methods.

The data bits may also be maintained on a computer readable medium including magnetic disks, optical disks, and any other volatile (e.g., Random Access Memory ("RAM")) or non-volatile (e.g., Read-Only Memory ("ROM")) mass storage system readable by the CPU. The computer readable medium may include cooperating or interconnected computer readable medium, which exist exclusively on the processing system or are distributed among multiple interconnected processing systems that may be local or remote to the processing system. It is understood that the representative embodiments are not limited to the above-mentioned memories and that other platforms and memories may support the described methods.

In an illustrative embodiment, any of the operations, processes, etc. described herein may be implemented as computer-readable instructions stored on a computer-readable medium. The computer-readable instructions may be executed by a processor of a mobile unit, a network element, and/or any other computing device.

There is little distinction left between hardware and software implementations of aspects of systems. The use of hardware or software is generally (e.g., but not always, in that in certain contexts the choice between hardware and software may become significant) a design choice representing cost vs. efficiency tradeoffs. There may be various vehicles by which processes and/or systems and/or other technologies described herein may be affected (e.g., hardware, software, and/or firmware), and the preferred vehicle may vary with the context in which the processes and/or systems and/or other technologies are deployed. For example, if an implementer determines that speed and accuracy are paramount, the implementer may opt for a mainly hardware and/or firmware vehicle. If flexibility is paramount, the implementer may opt for a mainly software implementation. Alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples may be implemented, individually and/or collectively, by a wide range of hardware, software, firmware, or virtually any combination thereof. Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Application Specific Standard Products (ASSPs); Field Programmable Gate Arrays (FPGAs) circuits, any other type of integrated circuit (IC), and/or a state machine.

Although features and elements are provided above in particular combinations, one of ordinary skill in the art will appreciate that each feature or element can be used alone or in any combination with the other features and elements. The present disclosure is not to be limited in terms of the particular embodiments described in this application, which are intended as illustrations of various aspects. Many modifications and variations may be made without departing from its spirit and scope, as will be apparent to those skilled in the art. No element, act, or instruction used in the description of the present application should be construed as critical or essential to the invention unless explicitly provided as such. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods or systems.

It is also to be understood that the terminology used herein is for the purpose of describing particular embodiments only, and is not intended to be limiting. As used herein, when referred to herein, the terms "station" and its abbreviation "STA", "user equipment" and its abbreviation "UE" may mean (i) a wireless transmit and/or receive unit (WTRU), such as described infra; (ii) any of a number of embodiments of a WTRU, such as described infra; (iii) a wireless-capable and/or wired-capable (e.g., tetherable) device configured with, inter alia, some or all structures and functionality of a WTRU, such as described infra; (iii) a wireless-capable and/or wired-capable device configured with less than all structures and functionality of a WTRU, such as described infra; or (iv) the like. Details of an example WTRU, which may be representative of (or interchangeable with) any UE recited herein, are provided below with respect to FIGS. 1A-1D.

In certain representative embodiments, several portions of the subject matter described herein may be implemented via Application Specific Integrated Circuits (ASICs), Field Programmable Gate Arrays (FPGAs), digital signal processors (DSPs), and/or other integrated formats. However, those skilled in the art will recognize that some aspects of the embodiments disclosed herein, in whole or in part, may be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein may be distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a CD, a DVD, a digital tape, a computer memory, etc., and a transmission type medium such as a digital and/or an analog communication medium (e.g., a fiber optic cable, a waveguide, a wired communications link, a wireless communication link, etc.).

The herein described subject matter sometimes illustrates different components contained within, or connected with, different other components. It is to be understood that such depicted architectures are merely examples, and that in fact many other architectures may be implemented which achieve the same functionality. In a conceptual sense, any arrangement of components to achieve the same functionality is effectively "associated" such that the desired functionality may be achieved. Hence, any two components herein combined to achieve a particular functionality may be seen as "associated with" each other such that the desired functionality is achieved, irrespective of architectures or intermediate components. Likewise, any two components so associated may also be viewed as being "operably connected", or "operably coupled", to each other to achieve the desired functionality, and any two components capable of being so associated may also be viewed as being "operably couplable" to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, where only one item is intended, the term "single" or similar language may be used. As an aid to understanding, the following appended claims and/or the descriptions herein may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"). The same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." Further, the terms "any of" followed by a listing of a plurality of items and/or a plurality of categories of items, as used herein, are intended to include "any of," "any combination of," "any multiple of," and/or "any combination of multiples of" the items and/or the categories of items, individually or in conjunction with other items and/or other categories of items. Moreover, as used herein, the term "set" or "group" is intended to include any number of items, including zero. Additionally, as used herein, the term "number" is intended to include any number, including zero.

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein may be readily broken down into a lower third, middle third and upper third, etc. As will also be understood by one skilled in the art all language such as "up to," "at least," "greater than," "less than," and the like includes the number recited and refers to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

Moreover, the claims should not be read as limited to the provided order or elements unless stated to that effect. In addition, use of the terms "means for" in any claim is intended to invoke 35 U.S.C. § 112, ¶ 6 or means-plus-function claim format, and any claim without the terms "means for" is not so intended.

A processor in association with software may be used to implement a radio frequency transceiver for use in a wireless transmit receive unit (WTRU), user equipment (UE), terminal, base station, Mobility Management Entity (MME) or Evolved Packet Core (EPC), or any host computer. The WTRU may be used m conjunction with modules, implemented in hardware and/or software including a Software Defined Radio (SDR), and other components such as a camera, a video camera module, a videophone, a speakerphone, a vibration device, a speaker, a microphone, a television transceiver, a hands free headset, a keyboard, a Bluetooth® module, a frequency modulated (FM) radio unit, a Near Field Communication (NFC) Module, a liquid crystal display (LCD) display unit, an organic light-emitting diode (OLED) display unit, a digital music player, a media player, a video game player module, an Internet browser, and/or any Wireless Local Area Network (WLAN) or Ultra Wide Band (UWB) module.

Although the invention has been described in terms of communication systems, it is contemplated that the systems may be implemented in software on microprocessors/general purpose computers (not shown). In certain embodiments, one or more of the functions of the various components may be implemented in software that controls a general-purpose computer.

In addition, although the invention is illustrated and described herein with reference to specific embodiments, the invention is not intended to be limited to the details shown. Rather, various modifications may be made in the details within the scope and range of equivalents of the claims and without departing from the invention.

Throughout the disclosure, one of skill understands that certain representative embodiments may be used in the alternative or in combination with other representative embodiments.

Although features and elements are described above in particular combinations, one of ordinary skill in the art will appreciate that each feature or element can be used alone or in any combination with the other features and elements. In addition, the methods described herein may be implemented in a computer program, software, or firmware incorporated in a computer readable medium for execution by a computer or processor. Examples of non-transitory computer-readable storage media include, but are not limited to, a read only memory (ROM), random access memory (RAM), a register, cache memory, semiconductor memory devices, magnetic media such as internal hard disks and removable disks, magneto-optical media, and optical media such as CD-ROM disks, and digital versatile disks (DVDs). A processor in association with software may be used to implement a radio frequency transceiver for use in a WRTU, UE, terminal, base station, RNC, or any host computer.

Moreover, in the embodiments described above, processing platforms, computing systems, controllers, and other devices containing processors are noted. These devices may contain at least one Central Processing Unit ("CPU") and memory. In accordance with the practices of persons skilled in the art of computer programming, reference to acts and symbolic representations of operations or instructions may be performed by the various CPUs and memories. Such acts and operations or instructions may be referred to as being "executed," "computer executed" or "CPU executed."

One of ordinary skill in the art will appreciate that the acts and symbolically represented operations or instructions include the manipulation of electrical signals by the CPU. An electrical system represents data bits that can cause a resulting transformation or reduction of the electrical signals and the maintenance of data bits at memory locations in a memory system to thereby reconfigure or otherwise alter the CPU's operation, as well as other processing of signals. The memory locations where data bits are maintained are physical locations that have particular electrical, magnetic, optical, or organic properties corresponding to or representative of the data bits.

The data bits may also be maintained on a computer readable medium including magnetic disks, optical disks, and any other volatile (e.g., Random Access Memory ("RAM")) or non-volatile ("e.g., Read-Only Memory ("ROM")) mass storage system readable by the CPU. The computer readable medium may include cooperating or interconnected computer readable medium, which exist exclusively on the processing system or are distributed among multiple interconnected processing systems that may be local or remote to the processing system. It is understood that the representative embodiments are not limited to the above-mentioned memories and that other platforms and memories may support the described methods.

Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Application Specific Standard Products (ASSPs); Field Programmable Gate Arrays (FPGAs) circuits, any other type of integrated circuit (IC), and/or a state machine.

Although the invention has been described in terms of communication systems, it is contemplated that the systems may be implemented in software on microprocessors/general purpose computers (not shown). In certain embodiments, one or more of the functions of the various components may be implemented in software that controls a general-purpose computer.

In addition, although the invention is illustrated and described herein with reference to specific embodiments, the invention is not intended to be limited to the details shown. Rather, various modifications may be made in the details within the scope and range of equivalents of the claims and without departing from the invention.

What is claimed is:

1. A method implemented by a wireless transmit/receive unit (WTRU) for wireless communications, the method comprising:
    determining a first set of encoding nodes used for creating a set of cyclic redundancy check (CRC) bits;
    determining a first set of polarization branches, wherein each of the first set of polarization branches is associated with a respective encoding node of the first set of encoding nodes used for creating the set of CRC bits;
    determining a second set of polarization branches, wherein each of the second set of polarization branches is at least one level higher than a respective polarization branch of the first set of polarization branches;
    performing one or more polar encoding operations for the second set of polarization branches, wherein the one or more polar encoding operations comprise removing, in a belief propagation (BP) decoding factor graph, one or more short cycles that originated from the set of CRC bits;
    generating a second set of encoding nodes based on the performed one or more polar encoding operations for the second set of polarization branches; and
    transmitting polar code bits using the generated second set of encoding nodes.

2. The method of claim 1, wherein the one or more polar encoding operations comprise:
    selecting one or more relaxation rules, and
    omitting or delaying one or more XOR operations for the second set of polarization branches.

3. The method of claim 1, further comprising:
    determining a maximum number of relaxed polarization branches in a polar encoder of the WTRU, and
    selecting a position, an index, and/or a layer of a set of encoding node bits based on the determined maximum number of relaxed polarization branches.

4. The method of claim 1, further comprising:
    determining a minimum number of relaxed polarization branches in a polar encoder of the WTRU, and
    selecting a position, an index, and/or a layer of a set of encoding node bits based on the determined minimum number of relaxed polarization branches.

5. The method of claim 1, further comprising:
    selecting, from an input layer or an intermediate layer of a polar encoder of the WTRU, one or more bits associated with the first set or the second set of encoding nodes.

6. The method of claim 1, further comprising:
    performing a reinitialization operation for a set of log-likelihood ratio (LLR) values of a left-to-right iteration using the set of CRC bits being applied between two half iterations of the BP decoder.

7. A wireless transmit/receive unit (WTRU) for wireless communications, comprising circuitry, including a transmitter, a receiver, a processor, and memory configured to:
    determine a first set of encoding nodes used for creating a set of cyclic redundancy check (CRC) bits;
    determine a first set of polarization branches, wherein each of the first set of polarization branches is associated with a respective encoding node of the first set of encoding nodes used for creating the set of CRC bits;
    determine a second set of polarization branches, wherein each of the second set of polarization branches is at least one level higher than a respective polarization branch of the first set of polarization branches;
    perform one or more polar encoding operations for the second set of polarization branches, wherein the one or more polar encoding operations comprise removing, in a belief propagation (BP) decoding factor graph, one or more short cycles that originated from the set of CRC bits;
    generate a second set of encoding nodes based on the performed one or more polar encoding operations for the second set of polarization branches; and
    transmit polar code bits using the generated second set of encoding nodes.

8. The WTRU of claim 7, wherein, when performing the one or more polar encoding operations for the second set of polarization branches, the processor is further configured to:
    select one or more relaxation rules, and
    omit or delay one or more XOR operations for the second set of polarization branches.

9. The WTRU of claim 7, wherein the processor is further configured to:
    determine a maximum number of relaxed polarization branches in a polar encoder of the WTRU, and
    select a position, an index, and/or a layer of a set of encoding node bits based on the determined maximum number of relaxed polarization branches.

10. The WTRU of claim 7, wherein the processor is further configured to:
    determine a minimum number of relaxed polarization branches in a polar encoder of the WTRU, and
    select a position, an index, and/or a layer of a set of encoding node bits based on the determined minimum number of relaxed polarization branches.

11. The WTRU of claim 7, wherein the processor is further configured to:
    select, from an input layer or an intermediate layer of a polar encoder of the WTRU, one or more bits associated with the first set or the second set of encoding nodes.

12. The WTRU of claim 7, wherein the processor is further configured to perform a reinitialization operation for a set of log-likelihood ratio (LLR) values of a left-to-right iteration using the set of CRC bits being applied between two half iterations of the BP decoder.

13. The WTRU of claim 7, wherein the WTRU is further configured to:
  determine a set of input encoding node bits for cyclic redundancy check (CRC);
  perform periodic grouping for the set of input encoding node bits;
  perform CRC encoding for each group of bits based on the performed periodic grouping;
  input CRC encoded bits to polar encoding;
  omit one or more XOR operations in polar encoding; and/or
  output polar code bits.

* * * * *